US005581621A

United States Patent [19]

Koyama et al.

[11] Patent Number: 5,581,621

[45] Date of Patent: Dec. 3, 1996

[54] AUTOMATIC ADJUSTMENT SYSTEM AND AUTOMATIC ADJUSTMENT METHOD FOR AUDIO DEVICES

[75] Inventors: Yoshihide Koyama, Ageo; Mitsuharu Shibasaki, Toda; Yoshitake Yokotsuka, Nakano-ku; Kazuo Kikuchi, Koshigaya, all of Japan

[73] Assignee: Clarion Co., Ltd., Tokyo, Japan

[21] Appl. No.: 229,986

[22] Filed: Apr. 19, 1994

Related U.S. Application Data

[63] Continuation of Ser. No. 53,267, Apr. 28, 1993.

[30] Foreign Application Priority Data

| | | | |
|---|---|---|---|
| Apr. 19, 1993 | [JP] | Japan | 5-114218 |
| Apr. 19, 1993 | [JP] | Japan | 5-114219 |
| Apr. 19, 1993 | [JP] | Japan | 5-114220 |
| Apr. 19, 1993 | [JP] | Japan | 5-114221 |
| Apr. 19, 1993 | [JP] | Japan | 5-114222 |
| Apr. 19, 1993 | [JP] | Japan | 5-114223 |
| Apr. 19, 1993 | [JP] | Japan | 5-114224 |
| Apr. 19, 1993 | [JP] | Japan | 5-114225 |
| Apr. 19, 1993 | [JP] | Japan | 5-114226 |
| Apr. 19, 1993 | [JP] | Japan | 5-114227 |
| Apr. 19, 1993 | [JP] | Japan | 5-114228 |
| Apr. 19, 1993 | [JP] | Japan | 5-114229 |
| Apr. 19, 1993 | [JP] | Japan | 5-114230 |

[51] Int. Cl.$^{6}$ ...... H03G 5/00

[52] U.S. Cl. ...... 381/103; 381/98

[58] Field of Search ...... 381/107, 103, 381/98, 101, 102, 104

[56] References Cited

U.S. PATENT DOCUMENTS

| | | | |
|---|---|---|---|
| 5,060,272 | 10/1991 | Suzuki | 381/107 |
| 5,239,586 | 8/1993 | Marui | 381/107 |

*Primary Examiner*—Curtis Kuntz
*Assistant Examiner*—Minsun Oh
*Attorney, Agent, or Firm*—Koda and Androlia

[57] ABSTRACT

A system for automatically adjusting an audio system with a programmable parametric equalizer includes an audio analysis unit that can be connected to the audio unit. The parametric equalizer adjusts the frequency response of the audio system in response to equalizer data stored in the audio system. The audio analysis unit generates various reference signals and applies the reference signals selectively to separate channels of the audio system. A microphone picks up audible output of the audio system as the parametric equalizer corrects it and the audio system outputs the reference signal. The audio analysis unit, by giving directions to a user or by directly programmably addressing the audio system, changes the equalizer data, amplifier gain, polarity of speaker connections and other parameters responsively to the output picked up by the microphone. The audio analysis unit also includes a floppy disk drive to store the results of the adjustments. If the adjustment data is lost, it can be restored from the stored copy made by the audio analysis unit. Through the present invention, a sophisticated audio system can be set up in a short period of time.

24 Claims, 25 Drawing Sheets

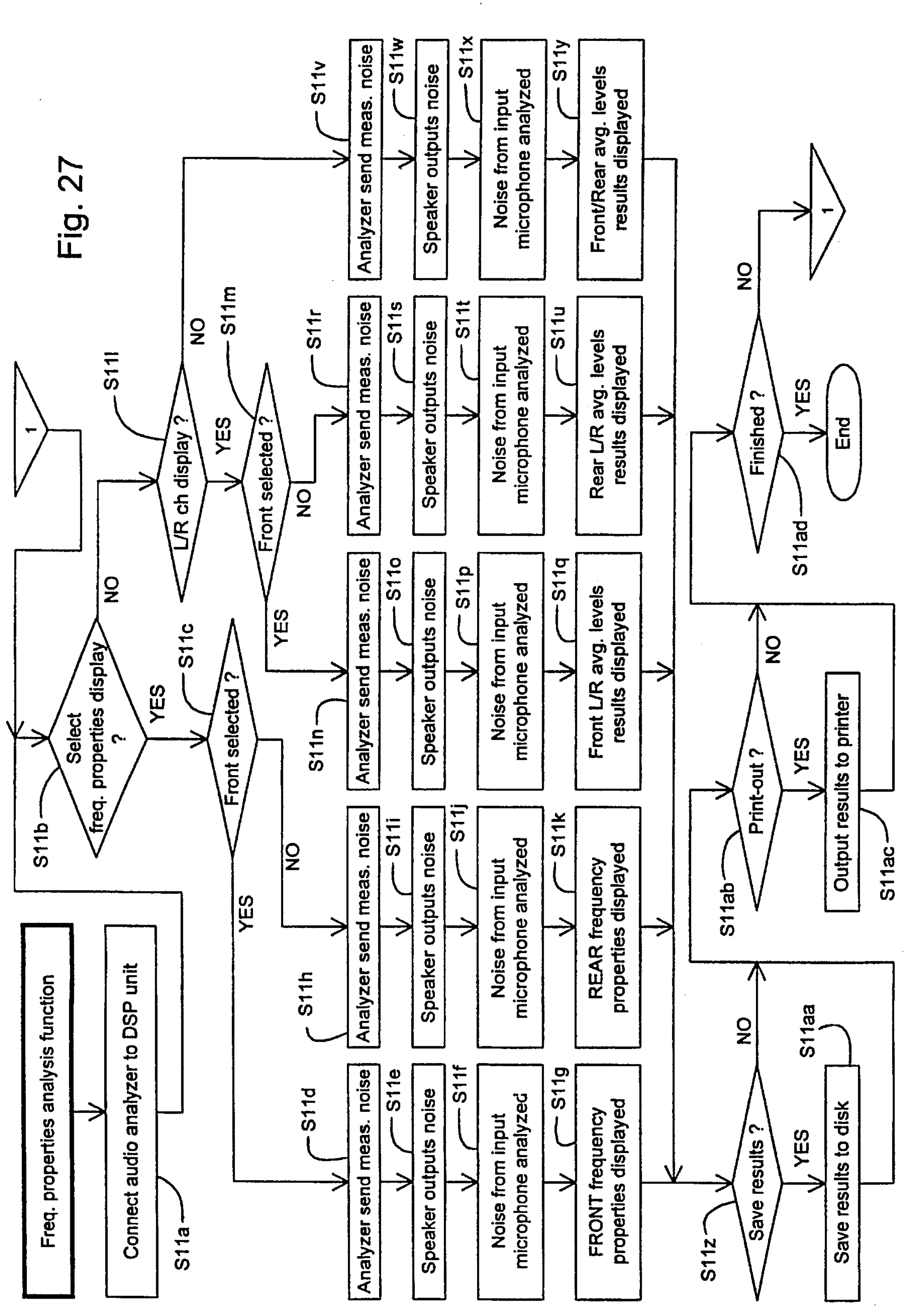
Fig. 27
Freq. properties analysis function
Connect audio analyzer to DSP unit
S11a
1
Select freq. properties display ?
S11b
YES
NO
Front selected ?
S11c
L/R ch display ?
S11l
Front selected ?
S11m
Analyzer send meas. noise
S11d
Speaker outputs noise
S11e
Noise from input microphone analyzed
S11f
FRONT frequency properties displayed
S11g
Analyzer send meas. noise
S11h
Speaker outputs noise
S11i
Noise from input microphone analyzed
S11j
REAR frequency properties displayed
S11k
Analyzer send meas. noise
S11n
Speaker outputs noise
S11o
Noise from input microphone analyzed
S11p
Front L/R avg. levels results displayed
S11q
Analyzer send meas. noise
S11r
Speaker outputs noise
S11s
Noise from input microphone analyzed
S11t
Rear L/R avg. levels results displayed
S11u
Analyzer send meas. noise
S11v
Speaker outputs noise
S11w
Noise from input microphone analyzed
S11x
Front/Rear avg. levels results displayed
S11y
Save results ?
S11z
Save results to disk
S11aa
Print-out ?
S11ab
Output results to printer
S11ac
Finished ?
S11ad
End

AUTOMATIC ADJUSTMENT SYSTEM AND AUTOMATIC ADJUSTMENT METHOD FOR AUDIO DEVICES

This application is a continuation of application Ser. No. 53,267 filed Apr. 28, 1993.

BACKGROUND OF THE INVENTION

The present invention relates to an automatic adjustment system and method for audio devices and specifically to such systems for performing acoustic correction of audio signals generated by audio devices.

Systems and methods for making acoustic adjustments of audio devices to tailor sound to suit a particular environment or listener's taste are known. For example, automobile audio systems that can be adjusted to tailor their sound output for the environment of a particular automobile, or for a type of music and musical taste are known art.

One of the motivations for making such acoustic adjustments is to achieve optimal sound quality in different environments. For example, different automobile interiors can have widely different shapes, materials which affect sound heard by passengers and driver. Interceding objects may also affect sound distribution and quality. To achieve ideal results in automobiles, acoustic corrections must be performed for each installation, since no two automobiles are identical. A corollary is, if acoustic adjustments are performed identically for every automobile, the acoustic results will not be identical from one automobile to another.

Such acoustic adjustment systems and methods generally employ a parametric equalizer connected to the audio system whose sound is to be altered. The parametric equalizer divides an audio signal into a number of frequency bands and selectively amplifies and attenuates each frequency band to achieve a desired sound quality. The series of amplifications and/or attenuations across a range of frequencies is called the equalizer data. Each of the frequency bands of sounds passing through the parametric equalizer is changed according to the equalizer data. A technician or user listens to recorded sounds passing through the parametric equalizer and inputs the equalizer data accordingly. To make the technician's adjustments more precise, the technician may use a digital sound processor to analyze the audio passing through the parametric equalizer while making the adjustments.

The inputting of the equalizer data may amount simply to the adjustment of a series of potentiometers, if the parametric equalizer is non-programmable. Equalizer data for a programmable parametric equalizer would be entered by manually keying in and storing the equalizer data.

Generally, a specialist, at an automobile or audio system retailer, would perform the above adjustments. The specialist must listen to sounds generated by the system after it is installed, determine the corrections to be made by trial and error, and store the required sound alteration parameters in a memory. A series of manual adjustments of the device may likewise be used by the specialist for this purpose.

In a prior art audio device, there is no way for the adjuster to know the desired frequency-response of the owner. The desired frequency response is the goal of the acoustic correction of the sounds actually generated by the speakers. Thus, if for some reason the settings previously stored in the memory of the device are lost, much trial and effort would be required to obtain the result desired by the owner to restore an identical acoustic space. Moreover, there is no way to know if the acoustic space is identical to the previous one or not.

A modern stereo audio system may have multiple channels, each directed to a particular speaker. For example, an automobile audio system might have subwoofers, low, mid and high range speakers in the front and low, mid and high range speakers in the rear. The arrangement is replicated for each of left and right stereo channels. Thus an automobile could have as many fourteen channels of sound to output, each having its own power amplifier. To insure that sound output by the audio system is balanced and that the desired frequency response is achieved, the respective gains of such a network of power amplifiers must be properly adjusted.

The installation of such prior art systems with their complex channel networks is plagued by other difficulties. Additionally, the prior art is complicated by a need for a procedure for connecting the channels of the power amplifiers to their respective speaker elements. As stated above, there may be fourteen or more different channels to connect correctly. This complexity tends to produce connection errors. In addition, to confirm the channel connections, it was possible to see if the speaker was on the right or the left or the front or the rear by manipulating the fader and balance controls. However, the connections to the different speaker elements located at a given location, i.e. the low-range, mid-range and high-range speaker elements, cannot be confirmed this way.

Another problem with regard to making and checking speaker connections is the polarity of the speaker connection. In any audio system, it is desirable for the amp and the speaker to be connected with the correct respective + (positive) and − (negative) polarities. If these polarities are incorrectly connected, the audio output from the speaker will be inverted, and the resulting sound quality can be significantly decreased. Operating manuals and other guides generally contain warnings admonishing the installer to connect the amp and the speaker carefully.

In addition, in prior art audio devices, if the power supply of the audio device is not turned off when the amp and the speaker are connected, there is a possibility that the audio device could be damaged. Since the correctness of the connection is frequently checked after connection by listening to the sound coming from the speaker, checking is difficult, especially when many speakers are involved.

Furthermore, some users consciously made reverse-polarity connections for certain types of music so they could enjoy the abnormal sound quality. However, making such changes is difficult because it entails changing the wiring of the speakers.

One of the problems with setting equalizer data such as cut-off frequencies, frequency-response slope limits, etc. is that such data must be set by actually listening to the sound from the speakers. There was no way for a system adjuster to know the actual network band widths accurately. Even using a device capable of measuring frequency response, only the end result of the adjustments could be known to the adjuster. Devices known in the prior art are only capable of indicating the equalizer data numerically. Such an indication does not lend itself to giving an adjuster feedback regarding the present settings of the parametric equalizer.

The prior art technology has several shortcomings. Adjusting the parametric equalizer's parametric data while listening to sounds generated by the audio device may be inordinately time-consuming. In addition, the result achieved can vary depending on the type of sounds (music, for example) used to make the adjustments. Moreover, variability can result from changes in the skill or personal bias of the specialist. Such variability can make consistent adjustment of audio systems difficult to achieve. Conventional devices do not adequately address this issue.

Another problem with the prior art is that correction data, if lost from memory, cannot be restored without redoing the acoustic adjustments. Once readjusted, because of the variability of specialists and other circumstances, the result may not be identical to the settings that were lost.

Still another problem with prior art systems is that adjustments appropriate for a particular car are made by changing the gain for each of a number of different channels of the power amplifier corresponding to the different speaker units. According to the prior art system, this is done by listening to the sound from the speakers and adjusting the volume of the power amplifier with a screw driver or knob. The process of adjusting the amplifier gain while actually listening to the sound from the speakers is difficult and tedious. In addition, the adjustment of a power amplifier, which, in a car, is typically mounted in the rear or the trunk, is very awkward after the amplifier has been mounted. Moreover, to adjust the gains of each channel of the power amplifier to achieve a desired balance, or other relationship therebetween, is a particularly onerous task with the prior art audio system.

The balancing of gain of the different channels involves a number of comparisons. The gain levels of front and rear speaker banks in an automobile audio system must be adjusted to provide a desired balance of the resultant output. The gain of each channel, each of which may drive a speaker corresponding to a different range of frequencies, must be adjusted so that the results of parametric equalization can be realized. In other words, the gains of the channels connected to the woofer speakers must be adjusted independently of the gains of the channels connected to the tweeter speakers. All of the channels gains must be adjusted so that the parametric equalizer can achieve a desired result. For example, if the gain of a tweeter channel is too high relative to a woofer channel, the desired frequency response characteristic cannot be obtained.

The display of sound level data, such as frequency response, can enhance the adjustment of the settings of the parametric equalizer by providing feedback to the user. However, frequency response data can be overwhelming, particularly when it is desired to understand the front, rear left and right channel outputs independently of each other. This is especially true since acoustic correction for the left channel and right channel the sounds output from the speakers on the front side or the rear side are for both channels combined.

It is nearly impossible to make sense of frequency response data by listening to one channel at a time because the channels are combined during normal listening. Furthermore, the average levels of the channels could not easily be adjusted using only the frequency response data because such data does not lend itself to comparing the different channels overall.

Aside from balancing the gains of each channel, the course adjustment of the absolute value of amplifier gain in prior art devices performed manually is generally done in the same way. The adjuster must listen to the sound coming from the various speakers and manually adjust the amplifier gain so the resulting sound output is within a certain range. If the gain is insufficient, the sound output will not be up to the rated capacity of the audio system. If the sound output is too high, a poor sound quality may result. The manual adjustment of the gain of each amplifier channel entails a great deal of time. In addition there is a risk of inaccuracy because of personal bias of the adjuster or idiosyncracies in the adjuster's sense of hearing.

In addition to being difficult to perform, network adjustments for balancing sound levels between front and rear and left and right channels are also time-consuming. This problem is likewise prone to human bias and error. To install sophisticated audio devices in cars, a specialist must make adjustments which involve some degree of personal judgement and store the results of his adjustments in the programmable parametric equalizer and amplifiers. If, for some reason, the adjustment data stored in the memory of the audio device is lost, it is necessary to go to the specialist at the tuning shop where the adjustments were made and have the whole adjustment process redone.

OBJECTS AND SUMMARY OF THE INVENTION

An object of the present invention is to overcome the drawbacks of the prior art.

Another object of the present invention is to provide an automatic adjustment system for audio devices that helps a used to achieve excellent sound quality.

Still another object of the present invention is to provide an automatic adjustment system for audio devices that can provide consistent adjustment of audio systems.

Still another object of the present invention is to provide an automatic adjustment system for audio devices that can provide rapid and reliable adjustment of audio systems.

Still another object of the present invention is to provide an automatic adjustment system for audio devices that can provide the user with the ability to restore previously saved adjustment parameters.

Still another object of the present invention is to provide a system for automatically adjusting the gains of different channels of an audio system network.

Still another object of the present invention is to provide a system for restoring a previous pattern of adjustments of the gains of different channels of an audio system network.

Still another object of the present invention is to provide an amplifier for audio devices whose gain is automatically controllable to permit very simple, convenient and rapid gain adjustment of gain.

Still another object of the present invention is to provide a multiple channel amplifier where the individual gains for each channel can be made identical in a convenient and efficient way.

Still another object of the present invention is to provide an automatically or remotely adjustable multichannel amplifier that is suitable for use in a system for performing automatic adjustment of the sound characteristics of an audio system.

Still another object of the present invention is to provide a means for checking speaker connections to audio systems with complex multichannel networks.

Still another object of the present invention is to provide a means for checking the polarity of speaker connections in an audio system.

Still another object of the present invention is to provide a superior method for detecting speaker polarity in audio units which can easily detect mistaken connections between an amp and a speaker, and which can change the polarity of the audio signal sent to the speaker to correct the connection to an improperly connected speaker.

Still another object of the present invention is to provide a superior device for comparatively displaying cut-off frequency, frequency response slope limits and other parametric equalizer settings data comparatively, with corresponding sound measurements, to permit an adjuster to perform more accurate and rapid adjustment of an audio system parametric equalizer.

Still another object of the present invention is to provide an audio system and method that permits simple and accurate adjustment of the absolute value of the gain of each amplifier channel to achieve desired sound output of the audio system.

Still another object of the present invention is to provide an audio system and method for restoring an acoustic space derived from settings that were previously erased from a programmable parametric equalizer.

Still another object of the present invention is to provide a system and method for adjusting gain level differences between the front of a car and the rear of a car, and that can re-set original network gain settings even if the data stored in memory is lost.

Still another object of the present invention is to provide a system and method for analyzing frequency response in audio devices by which frequency response and average output levels for left, right, front and rear channels can be meaningfully and usefully intercompared to enhance an adjuster's understanding of the results of adjustments made.

Still another object of the present invention is to provide an automatic adjustment system in audio devices by which rapid and predictable adjustments can be made without requiring an owner to refer to records and without requiring new adjustments to be made.

Briefly stated, . . .

According to an embodiment of the present invention, there is described, an automatic adjustment system for audio devices comprising: a memory for storing equalizer data, an audio device having programmable equalizer means for selectively modifying an audio output thereof according to the equalizer data, an audio signal analyzer having means for generating a reference signal, the audio signal analyzer being connectable to at least one of the programmable equalizer means and the audio device, the audio device including means for generating an audible output responsively to the reference signal, the audio signal analyzer having means for storing a goal profile, the audio signal analyzer including means for comparing the audible output with the goal profile and means for automatically adjusting the equalizer data responsively to a result of the comparing.

According to another embodiment of the present invention, there is described, an automatic adjustment system for an audio device, comprising: an audio analyzer, a digital signal processor connected to an output of the audio device, a multi-channel amplifier having channels, each having a respective gain, a time-alignment device for correcting a phase relationship between the respective signals, means for entering and storing a goal profile, means for storing equalizer data, the goal profile defining a desired frequency response of the audio device, a parametric equalizer of the digital signal processor having means for altering the frequency response of the audio device responsively to the equalizer data, the audio analyzer having means for generating a reference signal and transmitting the reference signal to the audio device, the audio analyzer having means for measuring the frequency response and the audio analyzer having means for changing the equalizer data responsively to the goal profile and the measuring.

According to still another embodiment of the present invention, there is described, an automatic adjustment system for audio devices comprising: an audio device having at least two amplifiers, each of the amplifiers having a gain, automatic adjustment means connectable to the audio device, means for controlling each of the gains of the amplifiers responsively to commands from the automatic adjustment means, the automatic adjustment means including: a microprocessor, a transmission unit for receiving control signals from the audio signal analyzer, each of the at least two amplifiers having an input, a signal applied to each of the inputs, an input control unit for attenuating the signal applied to the input, each of the input control units having an output, each of the amplifiers having a power amplifier and the output of the each of the input control units being applied to the power amplifier.

According to still another embodiment of the present invention, there is described, an automatic adjustment system for an audio system comprising: an audio device, the audio device having an output, the audio device having a programmable device for altering the output according to data stored in the programmable device to produce a corrected output, analyzer means for automatically evaluating the corrected output, means for connecting the analyzer means to the audio device, the means for connecting including a data link, the analyzer means including means for automatically revising the data responsively to the evaluating, means for monitoring an integrity of the data link, the means for monitoring including means for sending a connection check command from the analyzer means to the audio device and the means for monitoring including means for responding to the connection check command.

According to still another embodiment of the present invention, there is described, an automatic adjustment system for an audio device, comprising: an output of the audio device, the audio device having a programmable device for altering the output according to data stored in the programmable device, analyzer means for automatically evaluating the output, means for connecting the analyzer means to the audio device, the means for connecting including a data link, the analyzer means including means for automatically revising the data responsively to the evaluating during an automatic adjustment procedure thereof, a user interface having means for entering control commands and means for blocking the control commands during the automatic adjustment procedure.

According to still another embodiment of the present invention, there is described, a system for verifying speaker connections in an audio device, comprising: a first output channel of the audio device connected to a first speaker, a second output channel of the audio device connected to a second speaker, the first speaker being adapted for output of a first range of frequencies, the second speaker being adapted for output of a second range of frequencies, the first range of frequencies being, on average, different from the second range of frequencies, means for generating a reference signal and outputting the reference signal selectively through each of the first and second channels to selectively drive each the first and second speakers and the reference signal including a third range of frequencies.

According to still another embodiment of the present invention, there is described, a system for determining speaker connections in an audio device, comprising: a first output channel of the audio device connected to a first speaker, a second output channel of the audio device connected to a second speaker, the first speaker being adapted for output of a first range of frequencies, the second speaker being adapted for output of a second range of frequencies, the first range of frequencies being, on average, different from the second range of frequencies, means for generating a reference signal and outputting the reference signal through the first and second channels to drive the first and second speakers, the reference signal including a third range of frequencies falling substantially within the first range of frequencies, the third range of frequencies falling substantially without the second range of frequencies and means for selecting one of the first and second channels for output of the reference signal at a specified time.

According to still another embodiment of the present invention, there is described, a device for determining a polarity of a connection of a speaker to an audio device, comprising: means for generating a reference signal, means for outputting the reference signal through the audio device to drive the speaker, means for detecting an output of the speaker and analyzer means for comparing a phase of the output with the reference signal and outputting a result of the comparing.

According to still another embodiment of the present invention, there is described, a system for analyzing an output of an audio device, comprising: means for storing equalizer data, equalizer means for dividing the output into a plurality of frequency subbands, the equalizer means including means for selectively amplifying each the frequency subbands, first and second channels of the audio device, each of the subbands together with at least another of the subbands forming one of a plurality of bands, each consisting of a contiguous range of frequencies defined by a lower cutoff frequency and an upper cutoff frequency, means for selectably directing each of the bands to a corresponding one of the channels, means for detecting a frequency response of the output, means for generating a real-time histogram-type display of the frequency response and means for graphically displaying the lower cutoff frequency and the upper cutoff frequency of each of the bands with the histogram-type display.

According to still another embodiment of the present invention, there is described, a gain adjustment system for channels of a multichannel amplifier of an audio system, comprising: each of the channels having an adjustable gain, a parametric equalizer for modifying an output of the audio device and outputting separate signals, each of the signals being directed to a corresponding one of the channels, each of the channels having means for driving a respective speaker, the parametric equalizer having an input, analyzer means, connectable to the parametric equalizer, for generating a reference signal and applying the reference signal to the input of the parametric equalizer and the analyzer means including means for detecting a sound intensity level generated by an output of each of the respective speakers and indicating a result of the detecting.

According to still another embodiment of the present invention, there is described, an automatic adjustment system for audio devices comprising: a memory for storing equalizer data, an audio device having programmable equalizer means for selectively modifying an audio output thereof according to the equalizer data, an audio signal analyzer having means for generating a reference signal, the audio signal analyzer being connectable to at least one of the programmable equalizer means and the audio device, the audio device including means for generating an audible output responsively to the reference signal, means for storing a current goal profile, the audio signal analyzer including means for comparing the audible output with the current goal profile, means for automatically adjusting the equalizer data responsively to a result of the comparing, means for entering a proposed goal profile, the means for entering including means for comparing the proposed goal profile with the current goal profile stored in the means for storing and one of confirming and rejecting the proposed goal profile responsively to a result of the comparing.

According to still another embodiment of the present invention, there is described, an automatic adjustment system for audio devices comprising: a memory for storing programmable gain data and equalizer data, an audio device having programmable equalizer means for selectively modifying an audio output thereof according to the equalizer data, the audio device having programmable amplifier means for amplifying the audio output according to the programmable gain data, audio analyzer means, connectable to the audio device, having means for overwriting the programmable gain data and the equalizer data with adjusted programmable gain data and adjusted equalizer data, respectively, the audio signal analyzer having means for generating a reference signal, the audio device including means for generating an audible output responsively to the reference signal, the audio signal analyzer having means for storing goal data indicating a desired result of the amplifying and the modifying, means for comparing the goal data with the audible output and the audio analyzer including means for permanently storing the goal data, the adjusted gain data and the equalizer data.

According to still another embodiment of the present invention, there is described, a device for automatically adjusting an audio system, comprising: an audio device having an output, a signal processor, means for applying the output to the signal processor, means for storing equalizer data, the signal processor including means for altering a frequency response of the output, responsively to the equalizer data, to generate a corrected output, an audio analyzer, means for connecting the audio analyzer to the signal processor, means for entering a goal curve in the audio analyzer, the goal profile indicating a desired result of the altering when a reference signal is applied to the signal processor, the audio analyzer including means for storing the goal profile in the means for storing, the audio analyzer including means for generating the reference signal and applying the reference signal to the signal processor, the audio analyzer including means for measuring the frequency response, the audio analyzer including means for adjusting the equalizer data responsively to the measuring and the goal data, the audio analyzer including means for saving the goal profile and the equalizer data on a nonvolatile memory, the audio analyzer including means for printing out the goal profile and means for restoring the goal profile data and the equalizer data from the means for saving to the signal processor.

According to still another embodiment of the present invention, there is described, a device for automatically setting the gains of an audio system having a multichannel amplifier, comprising: an audio device, the audio device having an output, means for dividing the output into bands and outputting each of the frequency bands to a respective one of the channels, each of the bands being defined by a range of frequencies, analyzer means, connectable to the audio device, for generating a reference signal, a speaker connected to each one of the channels, means for outputting the reference signal to the multichannel amplifier whereby an audible output is generated, means for entering a goal profile indicating desired frequency response of the audible output, means for measuring a frequency response of the audible output, means for calculating a first curve comprising averages of the frequency response over each of the bands, means for calculating a second curve comprising averages of the goal profile over each of the bands, means for calculating a first difference between the first curve and the second curve minus a difference between the averages of the frequency response and the goal profile over one of the bands, means for calculating a second difference between the averages of the frequency response and the goal profile over another of the bands and means for adjusting a gain of the one of the channels corresponding to the another of the bands responsively to the second difference.

According to still another embodiment of the present invention, there is described, an automatic adjustment system for an audio device, comprising: an audio device, front and rear amplifiers, each having an input and an output, means for generating a reference signal and applying the reference signal to each of the inputs of the amplifiers, a front speaker connected to the output of the front amplifier whereby a front audible output is generated responsively to the reference signal, a rear speaker connected to the output of the rear amplifier whereby a rear audible output is generated responsively to the reference signal, means for measuring a first frequency response of the front audible output, means for measuring a second frequency response of the rear audible output, means for comparing a first average of the first frequency response to a second average of the second frequency response, the first average being taken over at least two points of the first frequency response and the at least two points lying between 200 Hz and 2 kHz.

According to still another embodiment of the present invention, there is described, an automatic adjustment system for an audio device comprising: the audio device having an output, means for correcting the output, the means for correcting including means for outputting a left channel signal and a right channel signal, a power amplifier for amplifying the left channel signal and the right channel signal to generate left and right output signals, means for driving left and right speakers responsively to the left and right output signals, respectively, means for outputting a reference signal to the means for correcting and for outputting a corrected version of the reference signal, alternately, to each of the left and right channels, the left and right speakers having respective audible outputs, means for measuring respective frequency responses of the respective audible outputs and means for simultaneously displaying the respective frequency responses of the left and right speaker outputs.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 27 is flowchart showing a procedure for displaying measured frequency response and various average output levels of the audio system of FIG. 1.

DETAILED DESCRIPTION OF THE PREFERRED EMBODIMENT

Figure 1:
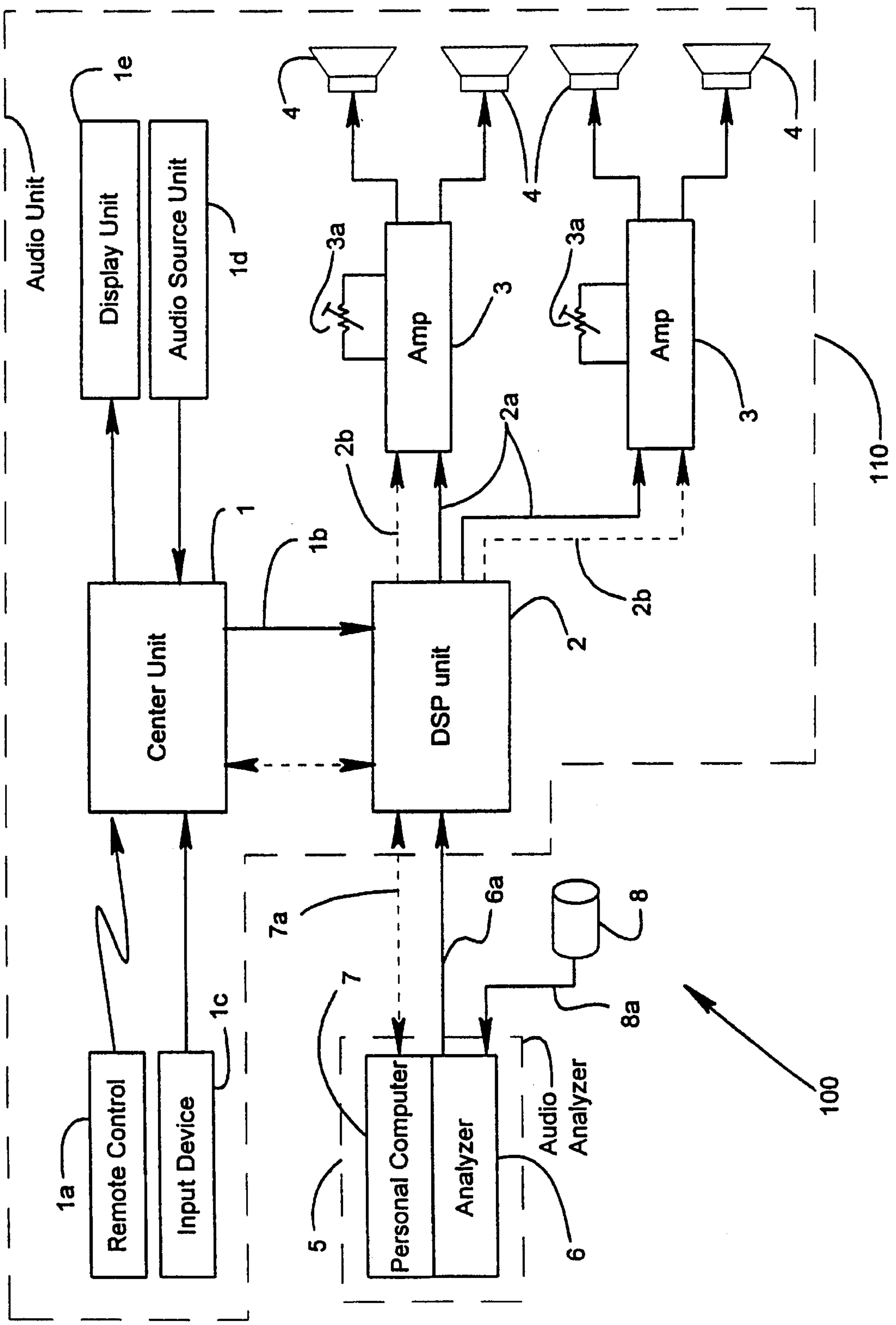
FIG. 1 is a diagram of an automatic adjustment system for audio devices according to an embodiment of the present invention.

Referring to FIG. 1, signal lines, indicated by solid lines, carry audio signals between the components of an automobile audio adjusting system shown generally at 100. Control lines, indicated by broken lines, carry control signals between the components of audio adjustment system 100. Broadly, audio adjustment system 100 consists of an audio unit 110 connected to an audio analysis unit 5. A center unit 1 receives commands from a built-in input device 1*c* such as a keypad or from a remote control 1*a*. Commands entered through built-in input device 1*c* or remote control 1*a* permit a user to select one of several audio source units 1*d* (only one shown) such as a CD deck or tape deck. Center unit 1 sends commands to a separate control processor (not shown) in audio source unit 1*d*. The commands control various functions and operating modes of audio source unit 1*d*. A digital audio signal 1*b* from audio source unit 1*d* is applied by center unit 1 to a digital signal processing unit 2.

Digital signal processing unit 2 contains a parametric equalizer, among other components, to generate multiple channels of corrected analog output 2*a* responsively to digital audio signal 1*b*. Analog output 2*a* is applied to respective channels of power amplifiers 3. The gains of power amplifiers 3 are set by gain adjustment knobs 3*a*. Power amplifiers 3 drive speakers 4 to deliver a corresponding sound.

An audio analysis unit 5 is connected to audio unit 110 in order to establish various settings of digital signal processing unit 2, including the equalizer data. Audio analysis unit 5 includes an analyzer unit 6 and a personal computer 7. The connection between audio unit 110 and audio analysis unit 5 consists of a control line 7*a* stemming from personal computer 7 and a fiber optic cable 6*a* stemming from analyzer unit 6. Control line 7*a* carries control signals and, in the current embodiment, consists of an RS232C line. However, it is noted that control line 7*a* could be any other kind of communication line suitable for applying multiple channel analog signals. Fiber optic cable 6*a* is used to transmit a reference audio signal, generated by analyzer unit 6, to digital signal processing unit 2. Digital signal processing unit 2 also generates multiple channel analog output 2*a* responsively to the reference audio signal, which is amplified and output by speakers 4. A microphone 8 responds to sounds generated by speakers 4 to generate a signal which is applied to analyzer unit 6.

Figure 2:
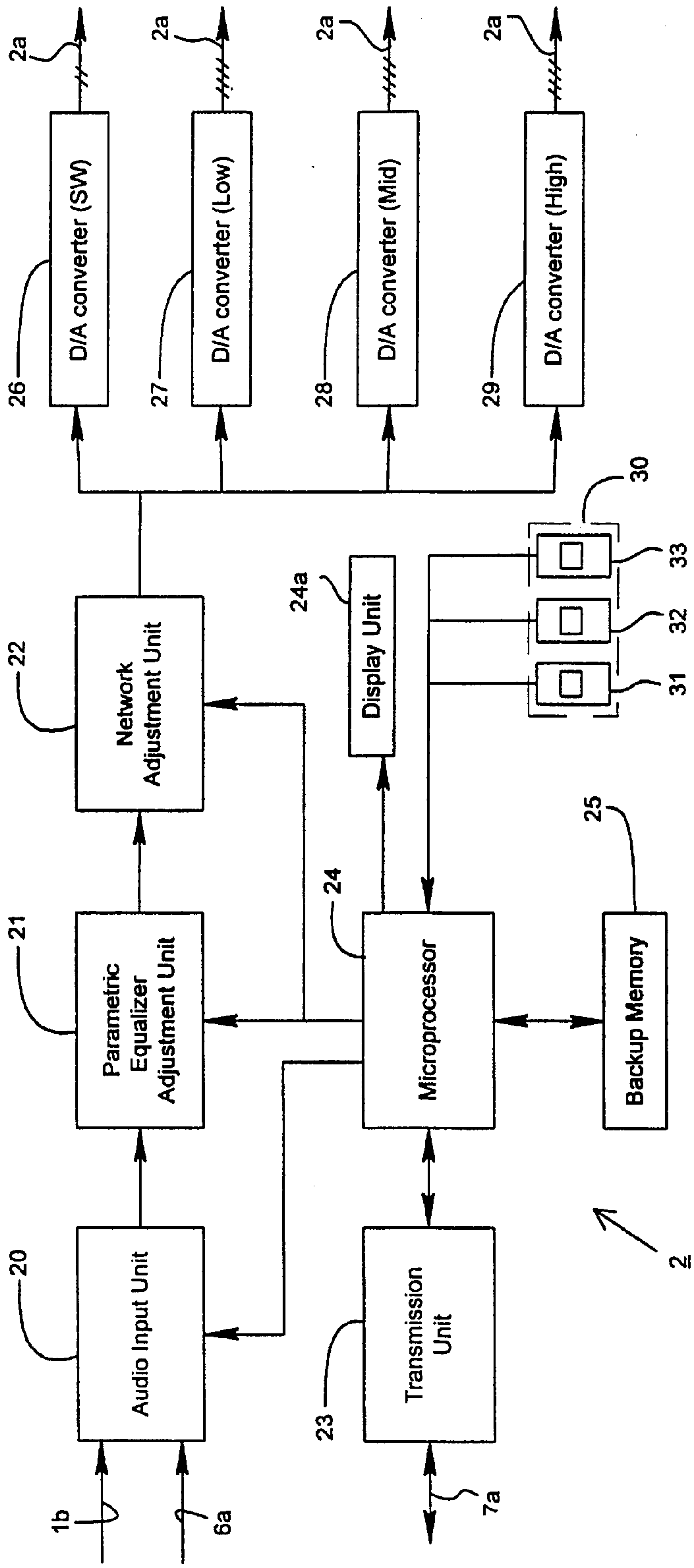
FIG. 2 is a diagram of a digital signal processing unit of the embodiment of FIG. 1.

Referring now also to FIG. 2, internal components of digital signal processing unit 2 of FIG. 1 are shown. An audio input unit 20 selects for input, either digital audio signal 1*b* from center unit 1 or the reference audio signal from fiber optic cable 6*a* from analyzer unit 6. The selection is made according to a selection signal from a microprocessor 24. The selected one of the reference audio signal from fiber optic cable 6*a* and digital audio signal 1*b* is applied to a parametric equalizer 21. Parametric equalizer 21 divides the selected signal into a predetermined number of frequency bands and selectively amplifies and attenuates each to achieve a desired sound quality. The pattern of amplification and attenuation imposed by parametric equalizer 21 is stored in a backup memory 25. An output of parametric equalizer 21 is then applied to a network adjustment unit 22. A display unit 24*a*, of digital signal processing unit 2, displays various information such as the listening position, equalizer data or other preprogrammed displays that are related to the current function of center digital signal processing unit 2.

Network adjustment unit 22, divides the audio signal, from parametric equalizer 21, into a plurality of frequency ranges based on cut-off frequencies slopes, etc that are input by a user. Network adjustment unit 22 also performs time-alignment of the respective signals in each frequency range and outputs the signals to respective D/A converters 26 through 29. Thus, two channels of audio information enter parametric equalizer 21 and two channels emerge. Network adjustment unit 22 receives two channels of audio information and outputs fourteen channels. Each of the left and right signals is broken into 4 frequency bands for front speakers and three frequency bands for rear speakers for a total of fourteen channels. Time-alignment of the respective bands is performed to insure that phases of the signals from the separate channels arrives at their respective speakers at such times as minimize phase distortion of the resultant sound. The times it takes for the audio signal output from main amplifier 3 to reach speakers 4 are not identical because the distance of transmission from audio unit 110 to speakers 4 are not identical and because the distances between speakers 4 and the listener or listeners are not identical. Unless the time-alignment of the signals corresponding to each speaker is adjusted, the sound arriving from the various speakers will have various phase relationships creating an undesirable distortion. A delay circuit (not shown) is included in network adjustment unit 22 of digital signal processing unit 2 to make the required time alignment adjustment. The time alignment adjustment is performed automatically.

A transmission unit 23 processes data and control signals on control line 7*a* transmitted to it by personal computer 7. A microprocessor 24 controls internal functions of digital signal processing unit 2. Backup memory 25, in addition to the equalizer data, stores time-alignment data. Backup memory 25 may consist of any suitable memory device such as $E^2$PROMs.

Each channel audio output from network adjustment unit 22 is applied to a respective one of D/A converters 26 through 29. D/A converts 26–29 convert the digital signals to analog audio signals. Each of D/A converters 26 through 29 is dedicated to a different one the frequency bands. D/A converters 26 convert signals destined for subwoofer loudspeakers. First and second D/A converters 26 convert the very low frequency band signals to be output by front/left and front/right speakers, respectively. The low range signals are destined for subwoofer loudspeakers. Correspondingly, first, second, third and fourth D/A converters 27 carry signals destined for front/right, front/left, rear/right and rear/left woofer loudspeakers, respectively. First, second, third and fourth D/A converters 28 carry signals destined for front/right, front/left, rear/right and rear/left mid-range loudspeakers, respectively. Finally first, second, third and fourth D/A converters 29 carry signals destined for front/right, front/left, rear/right and rear/left high-range loudspeakers, respectively.

Figure 3:
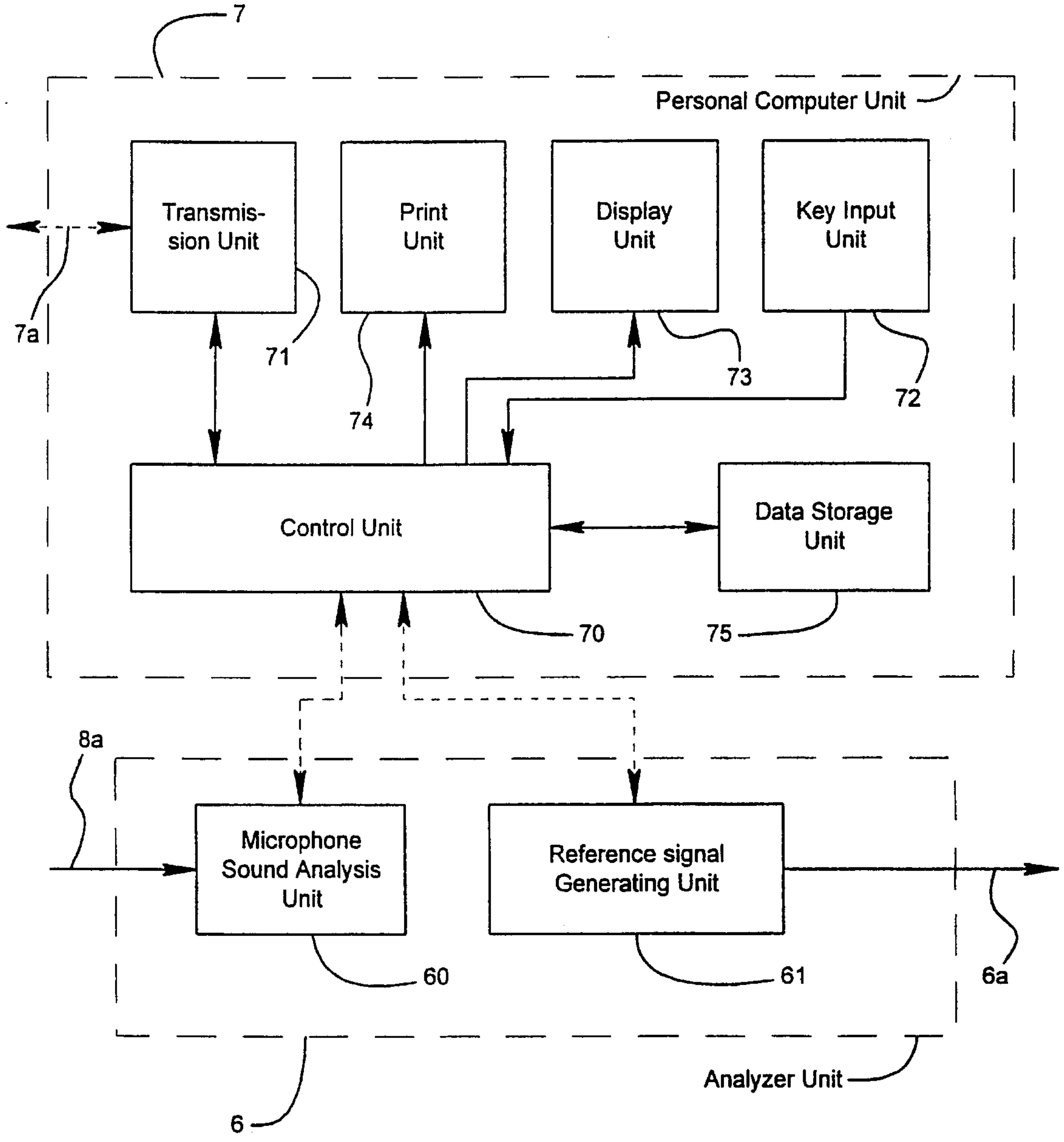
FIG. 3 is a diagram of an audio analyzer of the embodiment of FIG. 1.

Referring now also to FIG. 3, internal components of audio analysis unit 5 of FIG. 1 include analyzer unit 6 connected to microphone 8 and personal computer unit 7. Control signals are transferred between microphone sound analysis unit 60 and personal computer 7. A microphone sound analysis unit 60 receives an analog audio signal 8*a* from microphone 8 and converts it into a digital signal. An internal microprocessor of microphone sound analysis unit 60 analyzes the digital signal and outputs microphone analysis data, in the form of a frequency-response profile, to a control unit 70. A reference signal generating unit 61 generates a reference signal sent through fiber optic cable 6*a*. In the present embodiment the reference signal can be pink noise or a monotone. The pink noise encompasses the full range of frequencies which can be processed by center unit 1 and is used to set equalizer data for parametric equalizer 21. The monotone is used for testing connections to speakers 4. Reference signal sent through fiber optic cable 6*a* is applied to digital signal processing unit 2. An internal microprocessor (not shown) of reference signal generating unit 61 transfers control signals between reference signal generating unit 61 and personal computer 7.

Personal computer unit 7 includes a control unit 70, a microcomputer in the current embodiment of the invention. Control signals are transferred between control unit 70 and microphone sound analysis unit 60 and reference signal generating unit 61 of analyzer unit 6. A transmission unit 71, processes data and control signals on control line 7*a* transferred between audio analysis unit 5 and digital signal processing unit 2. Among the data sent to digital signal processor unit from personal computer 7 are the equalizer data used by parametric equalizer 21 of digital signal processing unit 2. In addition to equalizer data, transmission unit 71 transmits time alignment and network gain data used by network adjustment unit 22. Data are transferred between transmission unit 71 and transmission unit 23 of digital signal processing unit 2. As mentioned above, data and control signals on control line 7*a* are transferred over an RS232C link in the current embodiment. However, it is recognized that other data transmission systems could be employed.

A key input unit 72 allows the user to input commands, and data into personal computer 7. One important series of data, called a goal profile, indicates a desired frequency response for sound output by speakers 4. The goal profile differs from the equalizer data. The equalizer data tells the parametric equalizer how to amplify and attenuate the signal. However, the equalizer data cannot be derived directly from the frequency response desired to be output by speakers 4. This is because the frequency response of the output of speakers 4 cannot be predicted from the equalizer data because of the effect of the acoustic environment on sound output from speakers 4. One of the functions of audio adjustment system 100 is to determine the equalizer data that will result in the frequency response desired. That is, audio adjustment system 100 calculates the equalizer data necessary for the output from speakers 4 to match, or at least approach, the goal profile.

A display unit 73 displays various information during automatic adjustment. Data displayed on display unit 73 includes a main menu, a tuning menu, confirmation of speaker connections, etc. A print unit 74 prints out final data during and after completion of adjustments to audio unit 110.

Data storage unit 75 stores equalizer data used by parametric equalizer 21, time alignment data, network gain equalizer data and the goal profile. The data is stored on a permanent storage medium such as a floppy disk or hard disk. The storage of adjustment data by data storage unit 75 insures that stored adjustment data can be implemented if desired. For example, if an attempt to readjust produced inadequate results the prior settings can be restored. Alternatively, if the user desired to save a number of settings for different purposes, he could store and selectively implement each as desired.

In addition to adjustment data, data storage unit 75 in personal computer 7 of audio analysis unit 5 can also record comment data. For example, data storage unit 75 may store the tuning shop that performed the tuning, the name of the person who did the tuning, the date of the tuning, and the like. When audio analysis unit 5 transfers adjustment data to digital signal processing unit 2, the comment data is also transferred. The adjustment data and the comment data are recorded in back-up memory 25 of digital signal processing unit 2. Adjustment data recorded in back-up memory 25 can be re-written or deleted through user input, but the re-writing of the comment data is only possible through audio analysis unit 5.

Remotely Addressable Amplifier

Figure 5:
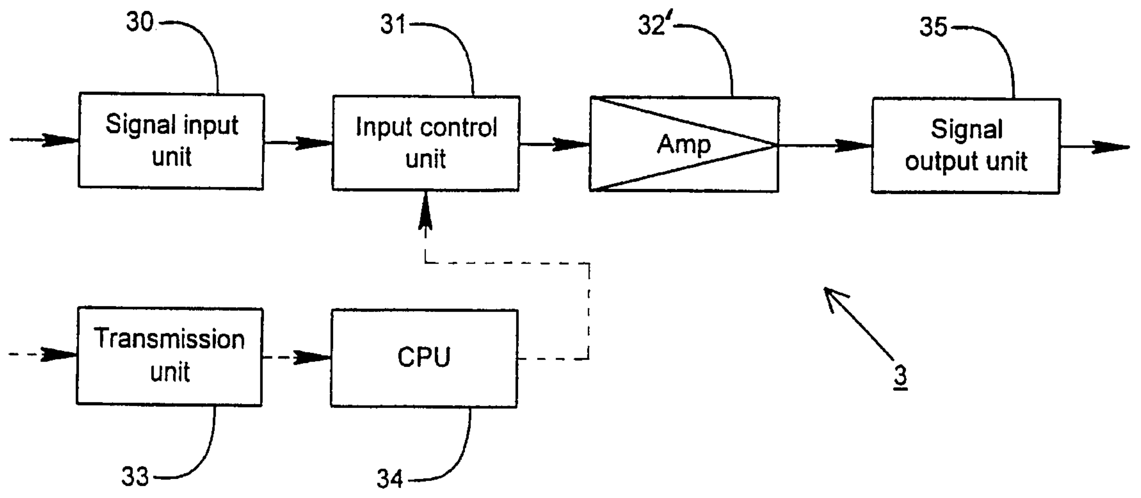
FIG. 5 is a block diagram of a power amplifier having a remotely adjustable gain.

Referring, now to FIG. 5, internal elements of one of power amplifiers 3 is shown. A signal input unit 30 receives and outputs either the audio signal output from digital signal processing unit 2 or the reference audio signal output from analyzer unit 6. Input control unit 31 dampens the audio signal output from signal input unit 30 based on a given control signal from a CPU 34. A power amplifier unit 32' amplifies the audio signal obtained from input control unit 31.

Transmission unit 33 processes the gain control setting information transferred between it and analyzer unit 6, which functions as an external control device. CPU 34 receives gain control setting information from analyzer unit 6 via transmission unit 33, and sends control signals to input control unit 31. Signal output unit 35 supplies the audio signal from amp unit 32 to speaker 4.

Figure 6:
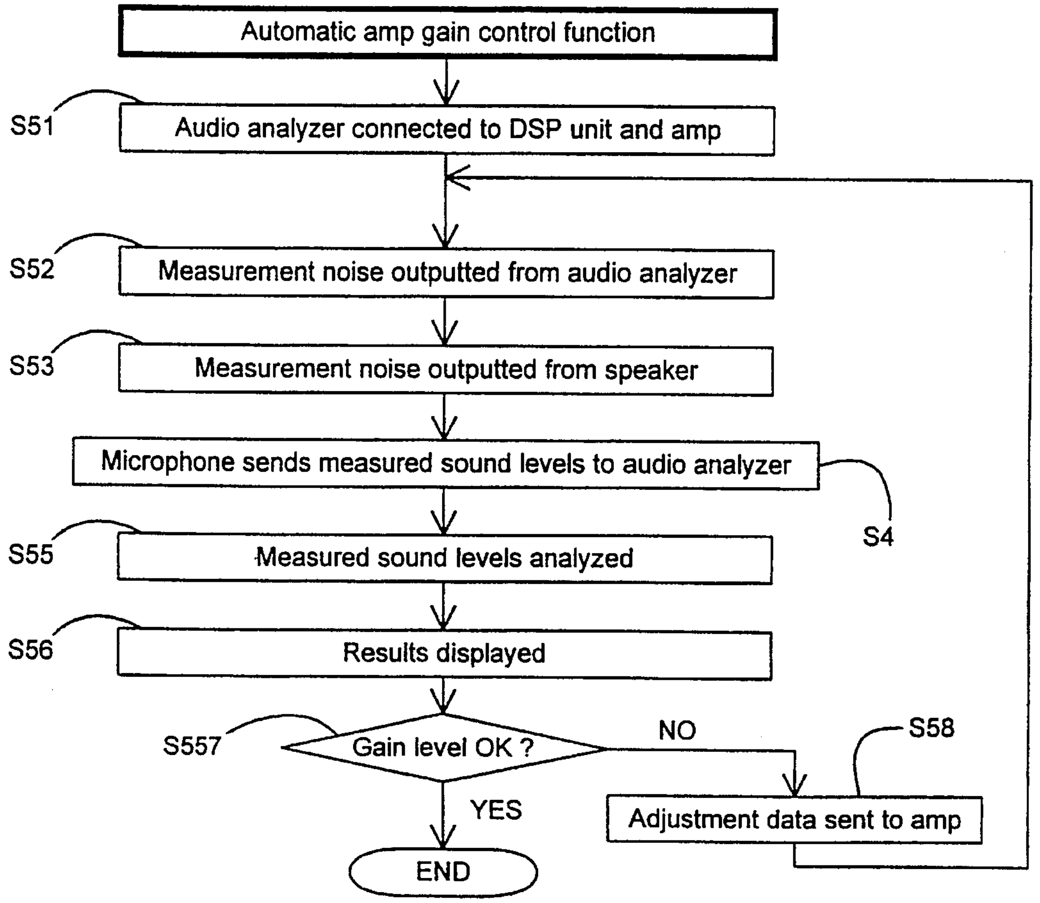
FIG. 6 is a flowchart showing a procedure for adjusting the gain of the remotely adjustable power amplifier of FIG. 5.

Referring now also to FIG. 6 an operation of the automatic amp gain control function begins with manually connecting audio analysis unit 5 to digital signal processing unit 2 and power amplifiers 3 in step S51. The reference signal is generated by audio analysis unit 5 and output to digital signal processing unit 2 in step S52. The corresponding sound generated by speakers 4 is picked up by microphone 8 and sent to audio analysis unit 5 in step S4.

The measurement noise input to audio analysis unit 5 is analyzed (step S5), and the results of the analysis are displayed (step S6). A check is made to see whether the amp gain is OK according to the displayed results of the analysis (step S7). If the result is OK, the automatic amp gain control function routine is completed. If it is not OK, the adjustment data is transferred to main amplifier 3 (step S8) and the procedures from step S2 through S8 are repeated until the amp gain becomes OK.

In this way, by having an internal CPU in main amplifier 3, and performing gain control on its own according to the gain control setting information from an external device, gain can be set easily without making direct adjustments using a screwdriver or the like. Also, by sending the measurement noise from audio analysis unit 5 to speaker 4 via amplifier 3, and analyzing the resulting sound, it is possible to make identical adjustments easily even if multiple channels of audio signals are being amplified.

As the above embodiment makes clear, the automatic gain control amplifier for audio devices of the present invention has a means for gain control equipped within the amplifier itself which sets gain according to gain setting information obtained from an external device. This allows gain control for an amplifier to be made very easily, and in cases where multiple channels are being amplified, the levels of each of the bands can be adjusted identically.

Overall Adjustment Procedure

The following description of an adjustment method assumes that the front speakers are being adjusted. It is noted that the same procedure could be applied to the adjustment of any suitable number of speakers.

Figure 4:
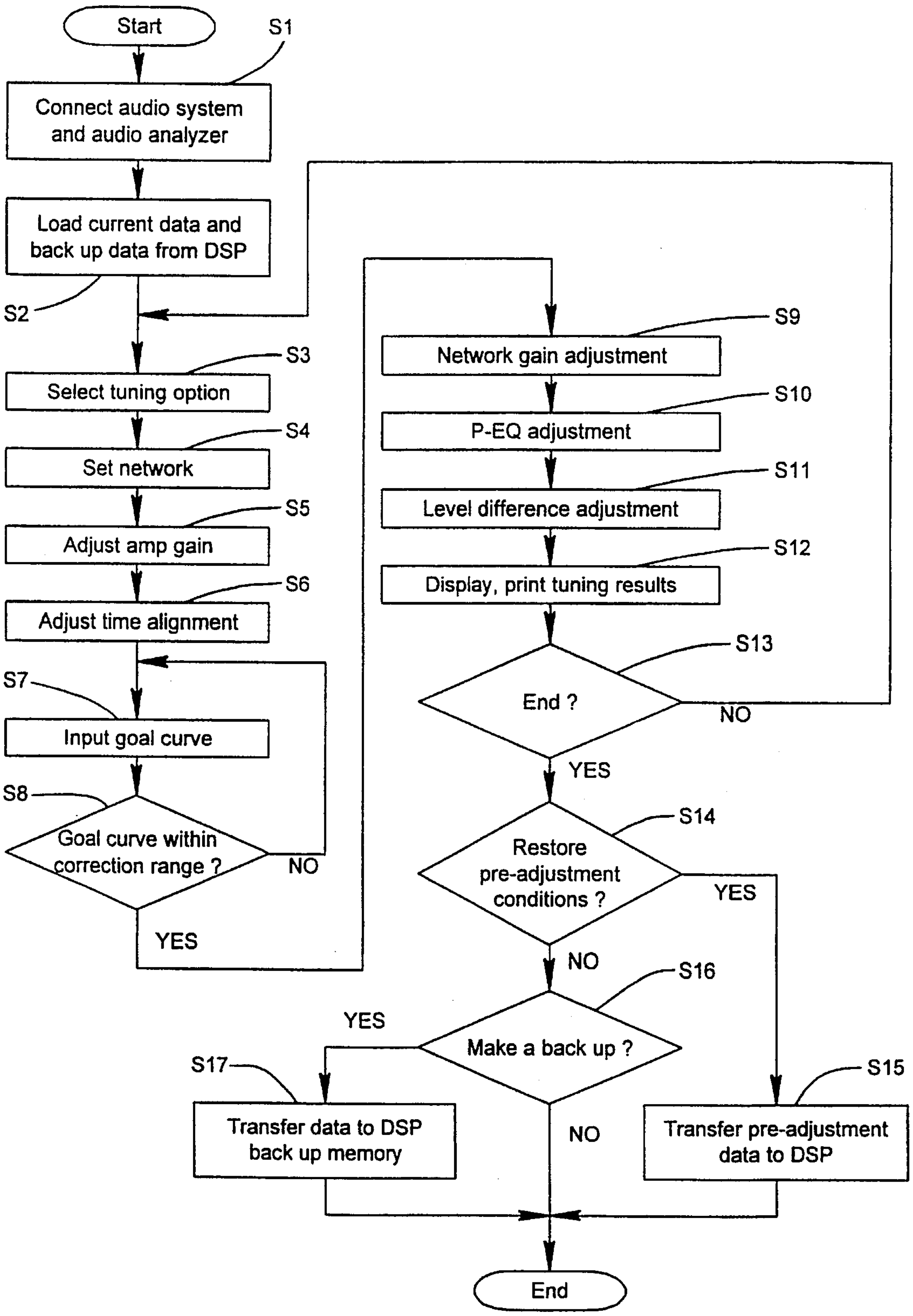
FIG. 4 is a flowchart showing a method for automatically adjusting the audio system using the automatic adjustment system of FIG. 1.

Referring now also to FIG. 4, A first step, S1, of an automatic adjustment method for using the audio adjustment system 100 according to an embodiment of the present invention begins with the connection of audio unit 110 to audio analysis unit 5. To complete the connection, digital signal processing unit 2 of audio unit 110 is connected by fiber optic cable *6a* to analyzer unit 6 at an audio input terminal (not shown) of digital signal processing unit 2. In addition, control line *7a* is connected link between personal computer 7 and digital signal processing unit 2.

Note that in the present case, three separate devices (analyzer unit 6, personal computer 7 and center unit 1) can be connected simultaneously to digital signal processing unit 2. This creates a need for a large or multiple connectors. However, it is recognized that it is not necessary to permit all three devices to be connected at a single time. It would also be possible for audio adjustment system 100 to be connectable to only one or two devices at a time. For example, center unit 1 and audio analysis unit 5 could use the same connector. Center unit 1 could be disconnected when adjustments are made and reconnected when adjustments are completed. In addition, in other embodiments, analyzer unit 6 and personal computer 7 could be combined into a single unit with a single connection to replace control line *7a* and fiber optic cable *6a*. A single link could be used to transfer both types of data, audio and control data, to replace control line *7a* and fiber optic cable *6a*.

After the above connections are completed, control software, run by personal computer 7, displays a main menu on display unit 73 which prompts the user to select one of various alternative functions. One of these is called a "tuning" operation. In step S2, the user strikes a prescribed key (not shown) on key input unit 72 to indicate the tuning selection causing current settings data and backup settings data to be loaded from digital signal processing unit 2 into a main memory (not shown) of personal computer 7. Current settings data are the data currently defining how digital signal processing unit 2 modifies audio signals. Backup settings data, as stated above, are settings data which had been saved into backup memory but which are not currently active. Display unit 73 displays a tuning menu. At step S3, the user selects one of various options on the tuning menu such as auto-tuning, manual tuning, parameter adjustments, confirm sound output, etc. by pressing a corresponding key of key unit 72.

If the auto-tuning option is selected at step S3, a position select menu is displayed. The position select menu displays choices pertaining to the set of channels to be adjusted. For example, the user can select "FULL SEAT" which selects all speakers or "FRONT R," which selects the channels that drive the front right speakers. A message, indicating a correct position for placing microphone 8, is displayed on display unit 73 according to the choice made by the user.

Next, after the channels to be adjusted are selected and the microphone positioned, a network set-up process begins in step S4. The network setup process includes establishing certain system parameters such as cut-off values to establish the boundaries of the frequency bands corresponding to the channel selected. For example, the upper boundary of the low band could be set at 2 kHz. Also established at this point are limits on equalizer data sound intensity vs. frequency slopes (dB/octave) and the phase relationships between the left and right channels. For example, the former could be set to 12 dB/octave and the latter to "+" indicating the left and right channels are driven in identical phase. These network settings are made manually through operating the prescribed keys on key input unit 72, but more on this will be described later.

Next, after network setup, gains of amplifiers 3 of FIG. 1 are set in step S5. Pink noise, which is the reference audio signal, is generated by reference signal generating 61 of analyzer unit 6 and transmitted to digital signal processing unit 2. A corresponding sound is output by speakers 4. The gain is set by user input to key input unit 72 which establishes the volume of the sound output by speaker 4.

In step S6, time alignment adjustments are made. As stated above, the adjustments are performed automatically. The time alignment function is not described in detail.

When the time alignment adjustment step is completed, the goal profile is entered in step S7. Before inputting a goal profile, the current equalizer data are confirmed. The user then elects to enter new settings or load a set of parameters from a pre-set curve file. If a new setting is chosen, a maximum of 31 band marks are set on the frequency axis. A line graph for these 31 points is shown. Referring to the line graph, the user chooses each of the frequency points in turn using key input to key input unit 72 and indicates the gain level at the chosen point by key input to key input unit 72.

After the goal profile has been entered, it is checked to determine that it lies within the parameters previously established at step S4. If the goal profile is not within the correction range, the user is prompted to readjust the goal profile or the network parameters entered in step S4.

In step S8, if the goal profile falls within the correction range, network gain adjustment is performed in accordance with the goal profile at step S9. Network gain adjustment consists of setting respective gains for each channel on the network automatically. Then equalizer data for parametric equalizer 21 are calculated and set automatically in step S10. In addition to equalizer data, the quality factor and center frequency for each frequency band corresponding to the goal profile are also set.

Next, a level difference adjustment is made in step S11 to establish a sound level difference between the left channel and the right channel. A level difference between the front and rear channels is also set automatically. The level difference adjustment is done to correct minor changes in level difference between front and rear arising from the setting of the parametric equalizer 21 parameters.

In step S12, the tuning results are displayed. The user may select an option to print the results using key input unit 72 if the user so desires. If the user selects the print option, print unit 74 of personal computer unit 7 prints out the tuning results.

In step S13, the user is prompted to indicate whether the user is finished with the tuning operation by keying a selection into key input unit 72. In the current embodiment for an automobile, the user may indicate several different locations for microphone 8. Microphone 8 may be at a front driver's seat, a passenger's seat, an entire front seat, a rear seat or an entire interior. Of course, other locations are also possible. The tuning operation may be performed for each desired position of microphone 8. Correspondingly, the user is prompted to select whether to perform the tuning operation for another position or whether to end the tuning operation.

When the user indicates that the tuning operation is completed, control proceeds to step S14 where the user is prompted to indicate whether the user wishes to restore the settings which existed prior to the tuning operation. This option is available because of the possibility the tuning operation did not achieve the desired effect. If the user elects to restore the previous parameters, the previous parameters are restored to digital signal processing unit 2 from the pre-adjustment data stored in data storage unit 75 of personal computer unit 7 in step S15.

If the user elects not to restore the pre-adjustment settings at step S14, the user is prompted to elect whether to back up the new adjustment data in step S16. If a backup is elected, the new adjustment data is transferred to backup memory 25 of digital signal processing unit 2 in step S17 and the program terminates. If no backup is to be made, the program simply terminates.

Verification of DSP-Analyzer Connection

Figure 7A:
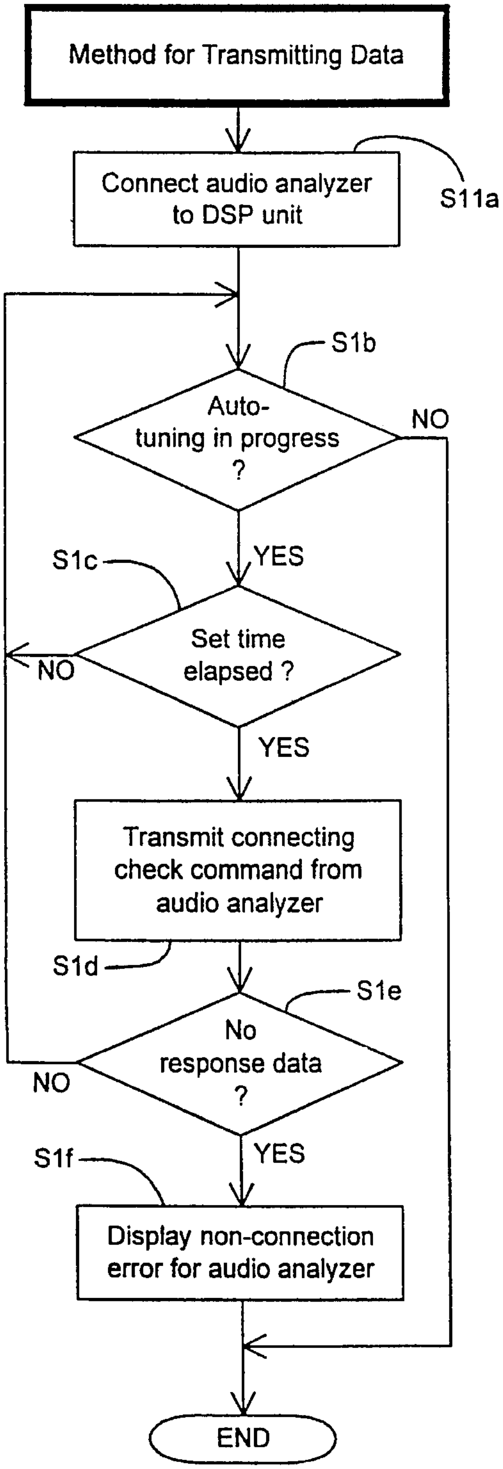
FIG. 7*a* is a flowchart showing a procedure for verifying the integrity of a connection between an analyzer and audio system of the adjustment system of FIG. 1.
Figure 7B:
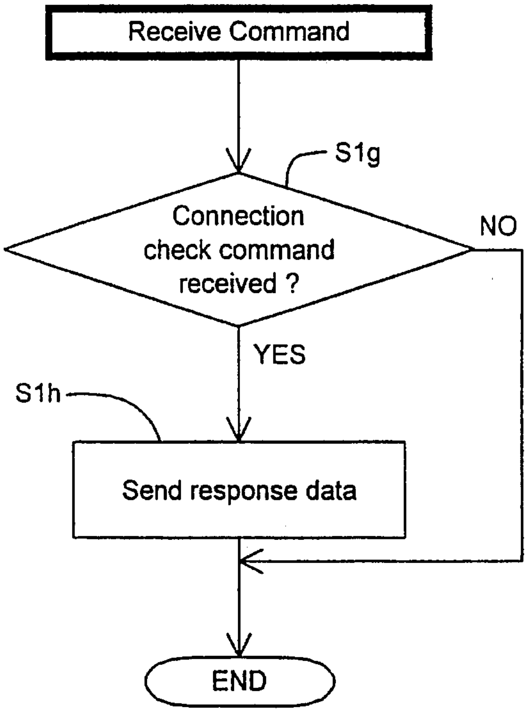
FIG. 7*b* is a flowchart of showing a counterpart procedure of FIG. 7*a* for verifying the integrity of the connection between an analyzer and audio system of the adjustment system of FIG. 1.

Referring to FIGS. 7*a* and 7*b*, the following is a description of a method for verifying the control line 7*a* connection between audio analysis unit 5 and audio unit 110. Once the connection of control line 7*a* is established between these devices, in step S3*a*, control proceeds to step S1*b*. The procedure terminates from step S1*b* if the automatic tuning program is not enabled. If the automatic tuning program is enabled, control proceeds to step S1*c* where a clock checked to see if a specified amount of time has elapsed. If the specified time has not yet elapsed, control returns to step S1*b*.

In step S1*c*, if the specified time interval has elapsed, a connection check command is transmitted from audio analysis unit 5 to digital signal processing unit 2 in step S1*d*. Next, in step S1*e*, audio analysis unit 5 checks to see if a response is received. If no response is received control passes to step S1*f* where an error message indicating the failure of the connection is displayed on display unit 73.

If, at step S1*e*, response data is received, control returns to step S1*b* and the procedure is repeated. The procedure is executed continuously during the automatic tuning procedure shown in FIG. 4.

At the same time the procedure of FIG. 7*a* is executing, another procedure, shown in FIG. 7*b* is executed by digital signal processing unit 2. This procedure is executed in parallel with the procedure of FIG. 7*a* to provide the return signal from digital signal processing unit 2 to audio analysis unit 5 prompted by the connection check command sent in step S1*d*. In step S1*g*, the procedure terminates of no connection check command is received by microprocessor 24 from audio analysis unit 5. If a connection check command is received, a response is sent in step S1*h*.

As the two procedures of FIGS. 7*a* and 7*b* are run in parallel during automatic adjustment, the connection check command is transmitted at a set interval from audio analysis unit 5 to digital signal processing unit 2. By checking the connection continuously and displaying an error message when the connection integrity is imperfect, the accuracy of data exchanged between digital signal processing unit 2 and audio analysis unit 5 is assured.

Blocking Interfering Input

In the system described above, adjustment of audio unit 110 is performed by connecting audio analysis unit 5 to audio unit 110. During adjustment, audio signals and data are transmitted between audio unit 110 and audio analysis unit 5. Effective and accurate results can only be obtained if some assurance is provided that no user-entered commands are made through center unit 1 or audio analysis unit 5 which would interfere with the process of adjustment. If a user-entered command is given from the main device or means for acoustic correction, it is possible that mis-tuning could result. Therefore, a means for preventing such interference is provided as described below.

Referring again to FIG. 1, audio analysis unit 5 is connected to audio unit 110 and the automatic tuning operation initiated. Personal computer 7 initiates testing and tuning of audio unit 110 by transferring commands over control line 7*a* to digital signal processing unit 2 and center unit 1. The commands issued by personal computer 7 instruct digital signal processing unit 2 and center unit 1 to generate the audio reference signal using selected channels to drive speakers 4. If the automated tuning process is chosen, audio analysis unit 5 measures the received reference signals and sends correction data to the digital signal processing unit 2 to produce a response approaching a chosen goal.

The automated tuning process reduces the possibility of an introduction of human error or unpredictable results due to personal biases of persons performing the tuning. A period of approximately 30 minutes is required to completely tune audio unit 110. Although the automated process accelerates the tuning procedure compared to manual adjustment of audio unit 110, the time period of 30 minutes is significant enough to present a hazard of unintentional interruptions of the tuning process. Such an interruption would normally require the tuning process to be re-initiated. For instance, while personal computer 7 is running the automated adjustment procedure, center unit 1 and digital signal processing unit 2 must be protected from extraneous inputs entered via signal input unit 30, input device 1*c*, or remote control 1*a*. Therefore, the present invention provides for the prevention of entry of erroneous information during automated adjustment.

Figure 8:
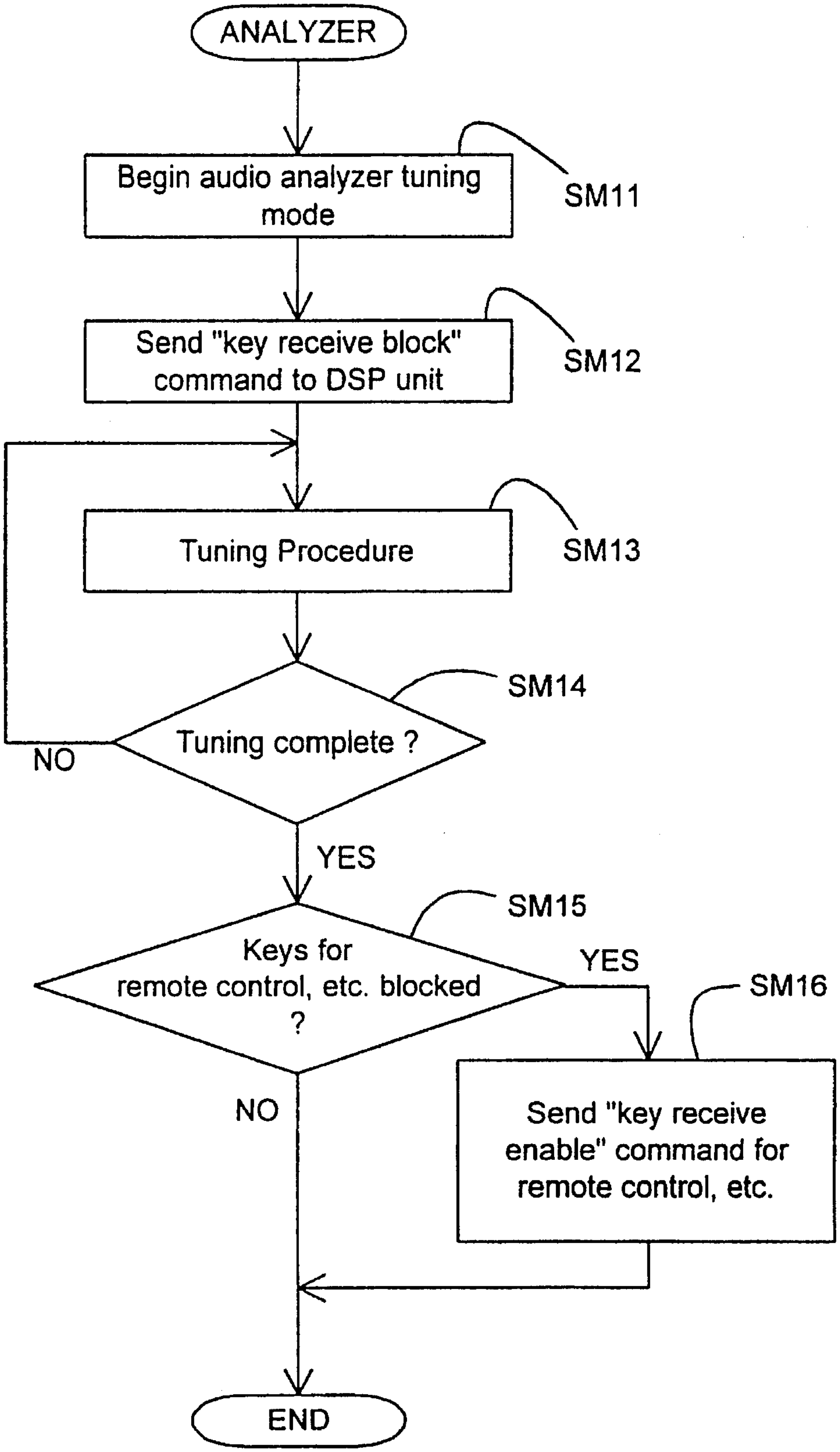
FIG. 8 is a flowchart showing a procedure for blocking interference due to user input to an audio analyzer of the automatic adjustment system of FIG. 1.

Referring to FIG. 8, a flowchart shows an input disabling portion of a program stored in audio analysis unit 5 which operates to prevent interruption of the automated testing procedure. At step SM11 the automated tuning process is initiated. The process is begun by the user when the user enters an appropriate instruction into personal computer 7. Personal computer 7 sends a "key receive block" command over control line 7*a* to digital signal processing unit 2 which instructs digital signal processing unit 2 to block, or in other words, disregard all key inputs received from signal input unit 30 following the initiation of the automated tuning process. Center unit 1 also receives this command since personal computer 7 is connected to center unit 1 via digital signal processing unit 2. Center unit 1 interprets this command as requiring that all inputs from remote control 1*a* or input device 1*c* be blocked. Subsequent to the issuance of the block command, audio analysis unit 5 proceeds to execute the automated tuning procedure at step SM13 which is follow by a verification step SM14. The verification step SM14 ensures that the tuning process is complete and determines whether the user wishes to repeat the adjustment procedure. If additional adjustment is desired, the program re-executes the automated tuning procedure at step SM13, otherwise, step SM15 is executed. At step SM15 audio analysis unit 5 checks to see if the block command is currently in effect by checking status data or querying digital signal processing unit 2 and center unit 1. If the block command is still in effect, a "key receive enable" command is sent to both digital signal processing unit 2 and center unit 1 at step SM16 and the program then ends.

Figure 9:
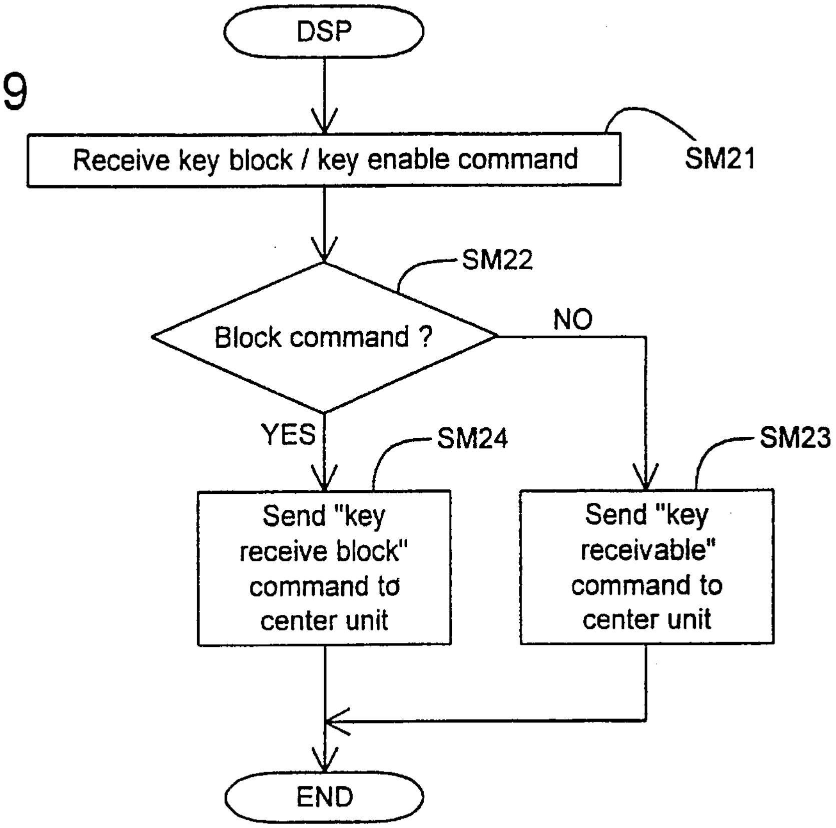
FIG. 9 is a flowchart showing a procedure for blocking interference due to user input to the digital signal processor of the automatic adjustment system of FIG. 1.

Referring now to FIG. 9, a flowchart shows an input disabling portion of a program stored in digital signal processing unit 2 which operates in conjunction with the input disabling programming of audio analysis unit 5 described above. At step SM21, digital signal processing unit 2 receives a command from audio analysis unit 5 which is either the "key receive block" command or the "key receive enable" command. Digital signal processing unit 2 then proceeds to identify the command at step SM22. If the command is a "key receive block" command, the program proceeds to disable responses to signal input unit 30 which includes a number of keys or switches for the operation of digital signal processing unit 2. Additionally, the program proceeds to relay the "key receive block" command to center unit 1. Alternatively, if the received command is a "key receive enable" command the program enables responses to signal input unit 30 and similarly transfers the command to center unit 1.

Figure 10:
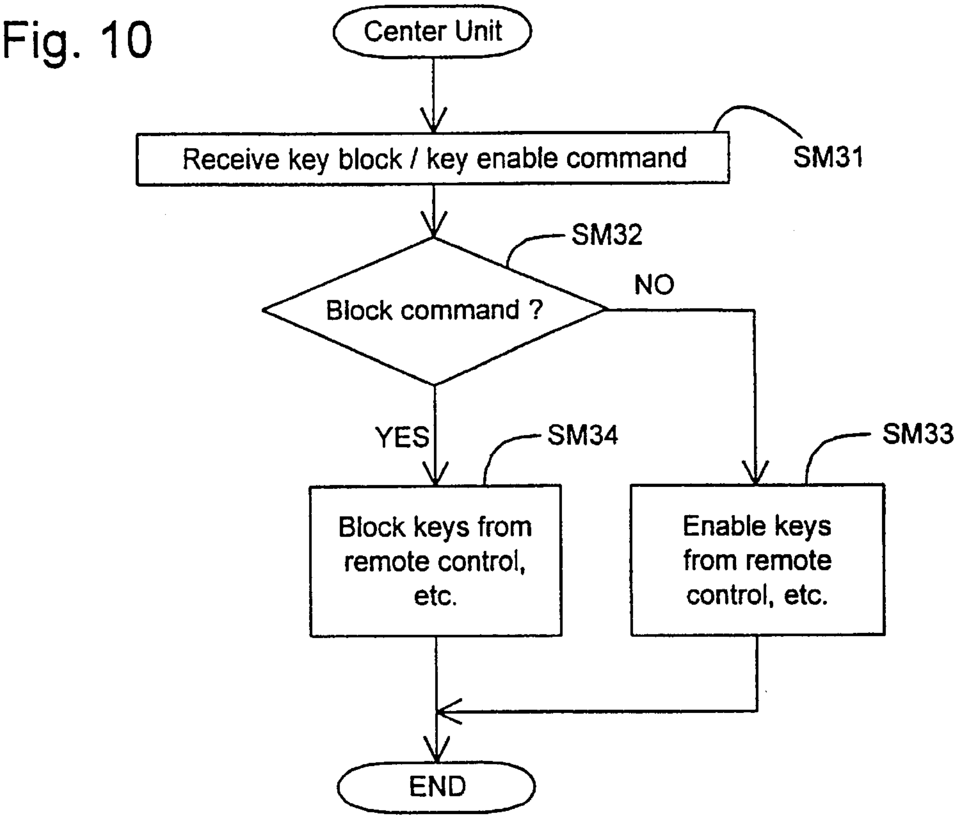
FIG. 10 is a flowchart showing a procedure for blocking interference due to user input to a center unit of the automatic adjustment system of FIG. 1.

Referring to FIG. 10, a flowchart shows an input disabling portion of a program stored in center unit 1 which operates in conjunction with programming of digital signal processing unit 2 and audio analysis unit 5. At step SM31, center unit 1 receives a command from digital signal processing unit 2 which is either the "key receive block" command or the "key receive enable" command. Center unit 1 then proceeds to identify the command at step SM22. If the command is a "key receive block" command, the program proceeds to disable responses to input device 1*c* and remote control 1*a*. Alternatively, if the received command is a "key receive enable" command the program enables responses to input device 1*c* and remote control 1*a*.

Therefore, the programming of audio analysis unit 5, digital signal processing unit 2 and center unit 1 is designed to prevent inadvertent interruption of the automated tuning process by disabling all input sources not required in the tuning process. Digital signal processing unit 2 performs the interfacing functions required for communication with audio analysis unit 5 and then proceeds to relay commands to center unit 1.

It is realized that while the above disclosed embodiment transfers commands to center unit 1 through the programming of digital signal processing unit 2, alternatively, digital signal processing unit 2 and center unit 1 may also share a common bus. Such alterations in architecture are realizable by those skilled in the art and are within the scope and spirit of the present invention.

Verifying Speaker Connections

Figure 11:
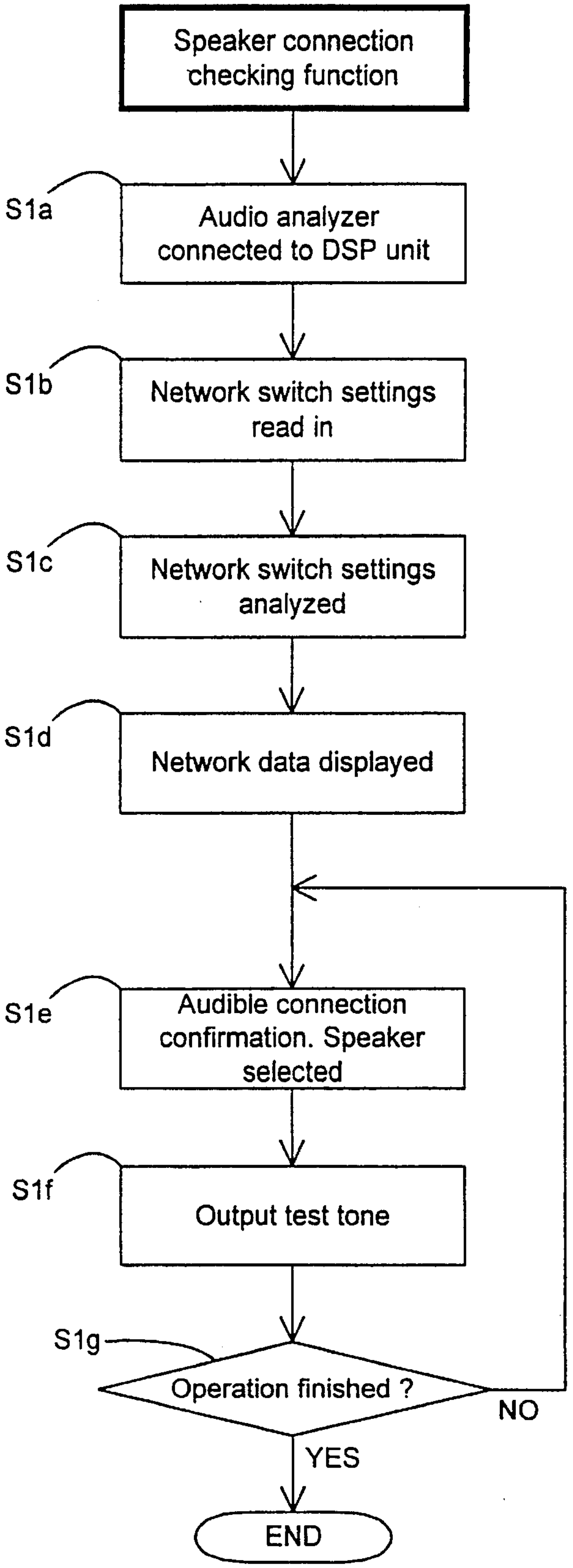
FIG. 11 is a flowchart showing a procedure for verifying speaker connections to different network channels of the audio system of FIG. 1.

Referring to FIG. 11, a procedure for checking speaker connections according to an embodiment of the present invention begins with the connection of audio analysis unit 5 to digital signal processing unit 2 in step S1*a*. The user keys a speaker connection test mode into personal computer 7 at step S1*b*. In addition, in step S1*b*, the settings of network switches 31, 32 and 33 are read into digital signal processing unit 2. The settings of network switches 31, 32 and 33 and the network data, are analyzed in step S1*c* and displayed on display unit 73 of personal computer 7. Network switches 31, 32 and 33 control the connections between amplifiers 3 and respective speaker channels.

Next, one of the channels for speakers 4 is selected to perform an audible connection confirmation in step S1*e*. The selection can be made by manipulating a cursor on personal computer 7 or some other means of indicating a selection. The selection of one of the channels for speakers 4 can also be done automatically by programming personal computer 7 to select channels in sequence. After a selection of a speaker channel is made, a reference signal is applied to digital signal processing unit 2 in step S1*f*. As a result, the selected channel drives one of speakers 4. The user confirms the connection by listening to the output of the driven speaker. If the correct speaker is driven, the user confirms the connection at step S1*g* by either indicating the procedure is completed, or by indicating a new selection is to be made. If a new selection is to be made, control resumes at step S1*e*. If the procedure is completed, the procedure terminates.

The confirmation of the speaker connection relies on the users ability to determine whether the driven speaker is the one that corresponds to the channel selected in step S1*e*. To determine which speaker is driven, the user listens to the pitch of the sound emanating from the speaker and the direction from which it comes. A channel that drives a speaker whose output range is in the high frequencies can be distinguished from a speaker whose output range is in the low frequencies by the sound quality emanating from the driven speaker. A woofer driven by a broad band signal, such as the pink noise reference signal, will sound markedly different from a mid-range or tweeter speaker driven by the same signal.

An alternative way to test the speaker connections is to employ a narrow band or monotone test signal incorporating frequencies that fall within the range of the speaker to which the selected channel is supposed to be connected. If this is done, an improperly connected speaker will produce an inaudible or muted sound. For example, a tweeter driven by a 30 Hz monotone signal would produce almost no sound.

A stated, the above procedure is performed for all speaker channels. By following the above procedure, the incorrect connection of speakers can be avoided.

Verifying Speaker Connection Polarity

Another element of proper speaker connection is the polarity of the speaker connections. Each one of speakers 4 can be connected to the correct channel, but if the polarity of the connection is not correct, imperfect sound quality may result. The following is a detailed description of the apparatus and method for checking and correcting speaker connection polarity.

Figure 12A:
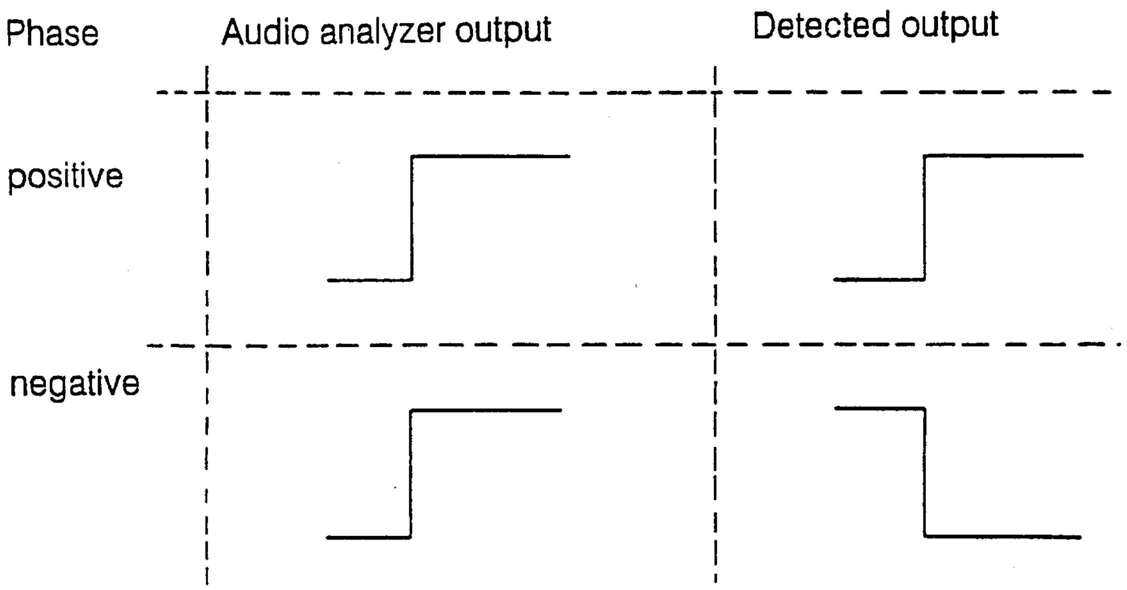
FIG. 12*a* is function diagram showing possible phase relationships occurring during the implementation of the procedure of FIG. 12*b*.

Referring to FIGS. 1 and 12*a*, to verify the polarity of a connection of a speaker 4 to a corresponding channel, a reference audio signal in the form of a pulse signal is sent from audio analysis unit 5 to digital signal processing unit 2. Digital signal processing unit 2 then applies the pulse signal to a selected one of speakers 4 via a corresponding one of amplifiers 3. The sound wave produced by the selected speaker travels to microphone 8 which converts the sound wave into a received pulse signal. A positive phase relationship exists where the pulse signal and the received pulse signal are in phase as shown in the top row of the chart of FIG. 12*a*. Conversely, a negative phase relationship exists where the pulse signal and the received pulse are in an opposing phase relationship as shown in the lower row of the chart.

Generally speaking, when the pulse signal and the received pulse signal are in a positive phase relationship, amplifiers 3 are connected to speakers 4 in correct polarity. Alternatively, if the polarities of an amplifier output terminals are reversed with respect to the speaker connections, the pulse signal and the received pulse signals are in a negative phase relationship. Following the analysis of the received pulse signal, the phase relationship is shown on display unit 73 of personal computer 7. The user can then readily check whether speakers 4 are correctly connected to amplifiers 3. Analyzer unit can then be directed to set digital signal processing unit 2 to produce a correct phase relationship. Alternatively, the user can optionally reverse the phase of the pulse signal sent to digital signal processing unit 2 during the testing of selected speakers. Analyzer unit 6 can then be instructed to set the phase such that it is intentionally reversed for a given one of speakers 4.

The phase relationship of audio outputs of speakers 4 is thus set correctly by digital signal processing unit 2 without the need for manually altering the wiring connections. This advantage eliminates the risk of shorting the outputs of amplifiers 3 which could permanently damage output sections of amplifiers 3. Furthermore, the phase relationship of the speakers can be corrected without powering down audio unit 110 because the speaker load on amplifiers 3 remains constant and the correction is effected digitally in digital signal processing unit 2.

Figure 12B:
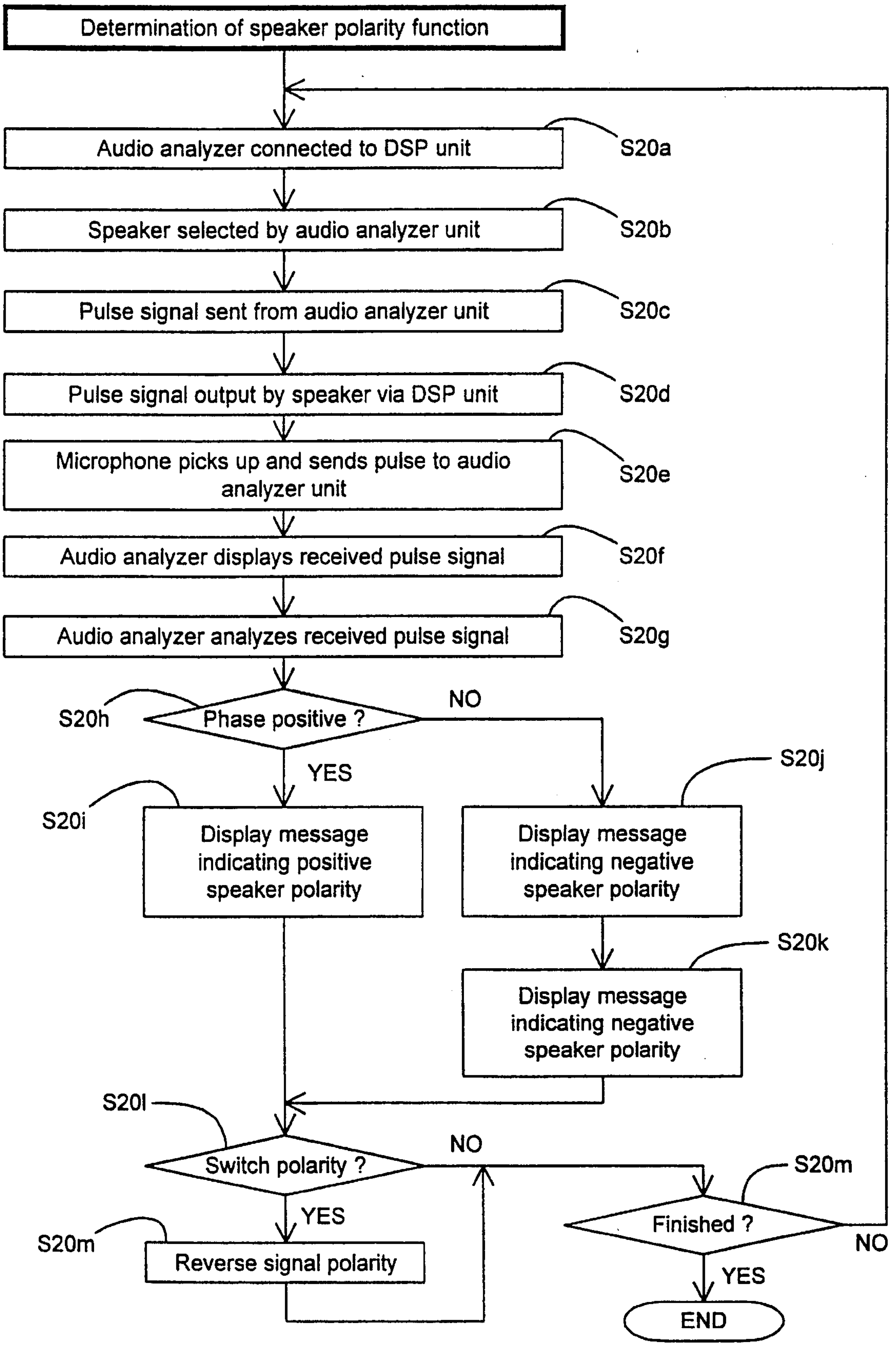
FIG. 12*b* is a flowchart showing a procedure for verifying the polarity of speaker connections of the audio system of FIG. 1.

Referring to FIG. 1 and 12*b*, a flowchart of a calibration portion of the programming of audio analysis unit 5 for testing and setting the speaker polarities of speakers 4. Once a user invokes the speaker polarity function of audio analysis unit 5, personal computer 7 prompts the user to connect audio analysis unit 5 to digital signal processing unit 2 at step S20*a*. Proceeding to step S20*b*, personal computer 7 sends a speaker selection command to digital signal processing unit 2 over control line 7*a*. The speaker selection command instructs digital signal processing unit 2 to output a subsequent audio reference signal to a select one of speakers 4. Once the speaker selection command has been accepted, step S20*c* is executed wherein analyzer unit 6 transmits the audio reference signal consisting of a pulse signal is sent in a digitized data format over fiber optic cable 6*a* to digital signal processing unit 2. While the present embodiment requires personal computer 7 to transfer audio reference data to digital signal processing unit 2 for subsequent reproduction, embodiments of the present invention are also realizable wherein audio reference data is stored in digital signal processing unit 2 or center unit 1.

In step S20*d*, digital signal processing unit 2 generates an analog waveform of the pulse signal from the digitized data. The analog pulse signal is then applied to the input of one of amplifiers 3 driving the selected speaker which outputs a pulse signal sound wave. The pulse signal sound wave travels to microphone 8 where it is converted into the received pulse signal and transmitted to analyzer unit 6 at step S20*e*. Step S20*f* is next executed wherein analyzer unit 6 displays the received pulse signal and the pulse signal sent to digital signal processing unit 2. Both the received pulse waveform and the pulse signal are displayed so that the user can visually evaluate whether the selected speaker is correctly connected to its driving amplifier.

Following the displaying of the received pulse signal, analyzer unit 6 performs an analysis of the received pulse waveform at step S20*g*. At step S20*h*, personal computer 7 determines whether the phase relationship of the pulse signal and the receive pulse signal is positive. If the relationship is positive display unit 73 indicates the positive relationship. Personal computer 7 can also produce a single audio beep or a speech synthesized message indicating a proper phase relationship in place of or in addition to the displayed message. Alternatively, if the phase relationship is negative a message to that effect is displayed at step S20*j*. A pair of audio beeps or a voice synthesized message may also be emitted. Next, at step S20*k*, personal computer 7 displays an error message indicating that the speaker connection is reversed which is also optionally conveyed by audio means.

Personal computer 7 prompts the user at step S201 to input whether the polarity of the selected speaker output should be reversed. If the user indicates that the polarity should be reversed, personal computer 7 proceeds to issue the appropriate command to digital signal processing unit 2, step S20*m*, to store digital correction data in memory effecting the reversal of polarity. Finally, at step S20*n*, the user is prompted to input whether the use of the speaker polarity function is completed. If the user inputs that the function is complete the program ends, alternatively, the program returns to step S20*a* and repeats the above procedure for either the same or another one of speakers 4. Generally, the user will repeat the procedure for each speaker of audio unit 110 until it is verified that the polarity is correct for each. Sometimes however, a user may purposefully switch polarity of a speaker to achieve a reverse polarity. In either case, audio analyzer unit 6 permits the user to verify the speaker connections and switch polarities as required without powering down the system or physically altering connections digital signal processing unit 2 effects all the polarity setting by applying appropriate digital data.

It is clear that modification of the above method and program may be effected by those skilled in the art. For instance, in an alternative embodiment the above procedure is configured to automatically check the polarity of each speaker connection and set the connection for a positive polarity where required without user intervention or confirmation. Such options as a print-out are includable wherein in the print-out can indicate the initial polarities and the final polarities. Additionally, while digital signal processing unit 2 digitally corrects the polarity of the speaker connections in the above embodiments, switches controlled by either digital signal processing unit 2 or center unit 1 maybe employed to effect a polarity reversal at the output of amplifiers 3. And finally, alternative reference audio pulse signal may be used instead of a standard pulse so long as the wave shape produces a wavefront that is uniquely discernable by analyzer unit 6. That is, the wavefront reaching microphone 8 must produce either a pressure increase or decrease that is not ambiguous.

Furthermore, although the above embodiment is directed toward an audio device for use in automobiles, it is clear that embodiments of the present invention are realizable for audio devices in general including those for home use. In such an embodiment, a condenser microphone would be mounted either within an audio unit or be provided with a connecting cable for interfacing the microphone with the audio unit. An alphanumeric LCD display, or an equivalent, is optionally provide with the audio unit along with a keypad for control of the calibration process. Alternatively, in place of the keypad, controls normally used for standard audio operation can serve to control a second function during calibration when a calibration mode is invoked. The LCD display is not however necessary if the audio unit includes audio indicating devices, such as a speech synthesizer or audio tine generator, for informing a user of the status of the calibration procedure. And finally, either an additional CPU is added to the audio unit or center unit 1 can assume the function of personal computer 7. Embodiments incorporating the above or similar modifications are considered to be fully within the scope and spirit of the present invention.

Therefore, the present invention provides a system for readily determining the status of speaker connections and effecting an adjustment of those connections. Various embodiments of the present invention generally provide computer driven system providing for ease of use even by users not acquainted with audio technology. Each speaker emits an audio reference signal with is picked up by a microphone and analyzed by the computer to determine if the signal phase is corrected. Based on the results the user may optionally change a polarity of the speaker's connection without powering down the audio unit. Alternatively, the system may automatically set all connection to a preferred polarity. Thus, mistakes encountered in speaker connections are readily correctable and the possibility of damage to the audio unit is minimized.

Adjusting Frequency Bands

Figure 13:
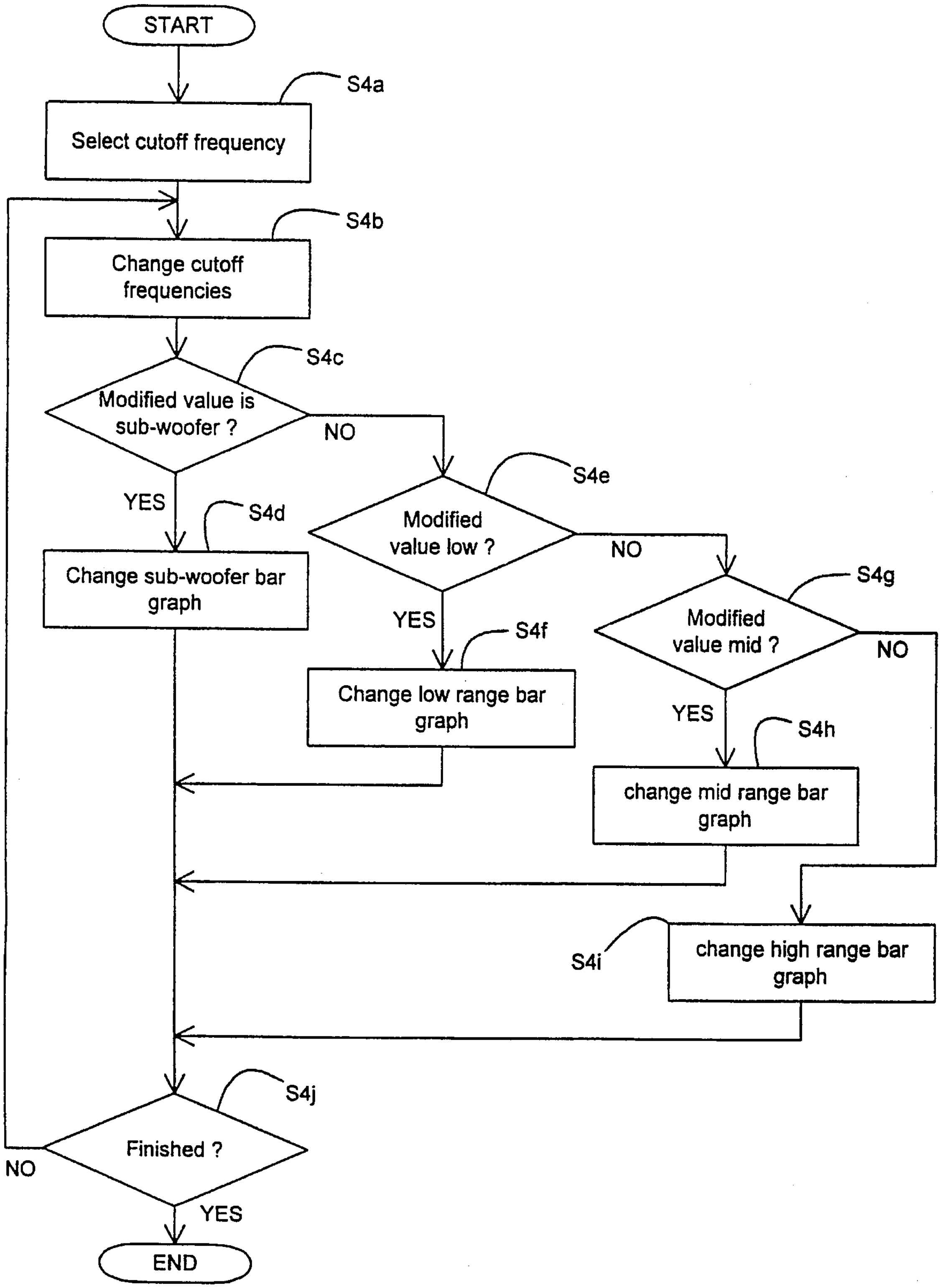
FIG. 13 is a flowchart showing a procedure for displaying low and high end cutoff frequencies of channel frequency bands of the digital signal processing unit of FIG. 2.
Figure 14:
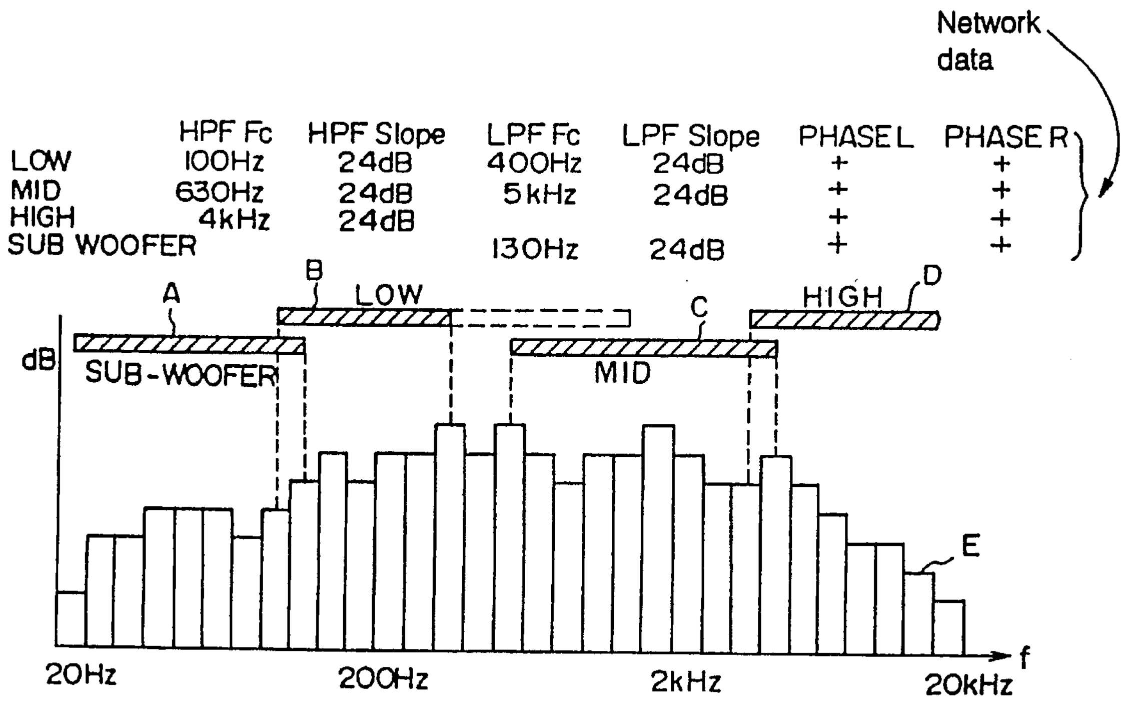
FIG. 14 is a diagram of a display produced by the procedure of FIG. 13.

Referring to FIGS. 1–4, 13 and 14 the flowchart of FIG. 13 shows details of a procedure for setting cutoff frequencies which corresponds to step S4 of the flowchart of FIG. 4. FIG. 14 indicates the output of display unit 73 during adjustment of the cutoff frequencies. The procedure begins when a command to begin selection of cut-off frequencies is input by the user through key input unit 72 in step S4*a*. In step S4*b*, the user changes a cut-off frequency value using key input unit 72. In step S4*c*, it is determined if the new value is for the sub-woofer or not. If the new value is for the sub-woofer, the subwoofer network band is changed according to the modified value in step S4*d*. In addition, in step S4*d*, a subwoofer bar graph A on display unit 73 showing the frequency bands is changed to reflect the new cutoff frequency.

FIG. 14 shows a sample display format to show the user current frequency cutoff values and other network data. The other network data include the upper and lower cutoff slopes for each band. Also shown are the phase relationship of the different channel connections, that is, the polarity of the audio signal output for each channel. As can be seen, eight channels are shown. The eight channels correspond to the sub-woofer, low mid and high range bands for each of the left and right channels. Bar graphs A, B, C and D indicate the extents of the four network bands based on the cut-off data. Also shown is the measured frequency response of the sound produced by speakers 4.

The bar graphs data are updated continuously to show the user the frequency response, cutoff frequencies, etc. For example, when the high-range cut-off frequency for the woofer network band is changed from 1.6 kHz to 400 Hz, the length of low-range bar graph B changes immediately from the position indicated by the dotted line to the position indicated by the solid line in FIG. 14.

If it is determined, in step S4*c*, that the new cutoff frequency is not for the sub-woofer, control passes to step S4*e*. In step S4*e*, the new value is checked to determine if it is for the low band. If the new cutoff frequency is for the low band, control passes to step S4*f*. In step S4*f*, the cutoff frequency is changed and the low range bar graph B updated accordingly. If the new cutoff frequency is not for the low band, control passes to step S4*g*.

In step S4*g*, the new value is checked to determine if it is for the mid-range band. If the new cutoff frequency is for the mid-range band, control passes to step S4*h*. In step S4*h*, the cutoff frequency for the mid-range band is changed and the bar graph updated accordingly. If the new cutoff frequency is not for the mid-range band C, control passes to step S4*i*. In step S4*i*, the cutoff frequency for the high-range band is changed and the high range bar graph D updated accordingly.

From steps S4*d*, S4*f*, S4*h* and S4*i*, control passes to step S4*j* where the user is prompted to indicate whether the adjustment of cutoff frequencies is completed. If the user indicates the task is not completed, passes to step S4*b*, otherwise the routine terminates.

With the current invention, changing cut-off frequencies results in real-time update of the bar graph display. Because the adjustment is done in real time, the user can hear from the speakers the results of the changes in cutoff frequencies. This allows the current network bands to be determined immediately and precisely with audio confirmation of the results. In addition, when the slope values for each of the cut-off frequencies are changed, the frequency response graph is also correspondingly updated.

Adjusting Power amplifier Absolute Gain

Figure 15:
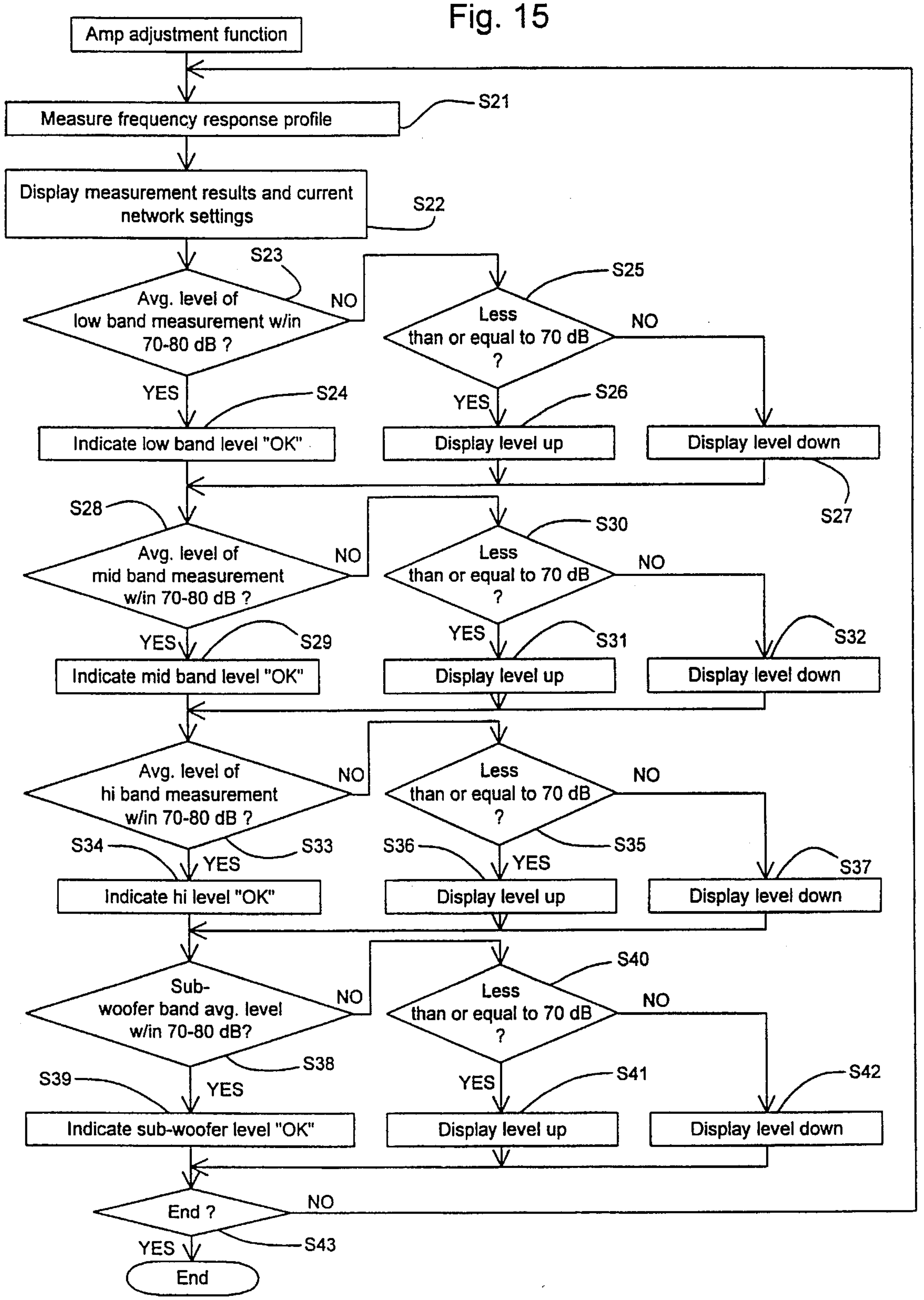
FIG. 15 is a flowchart showing a procedure for adjusting the absolute gain value of power amplifiers of the audio system of FIG. 1.

Referring to FIGS. 1–4 and 15, details of a procedure performed at step S5 of FIG. 4 for manually adjusting the gain of amplifier 3 is shown in a flowchart in FIG. 15. At step S5 of FIG. 4, the reference signal (pink noise in the current embodiment) generated by reference signal generating unit 61 of audio analysis unit 5 is output by speakers 4. At the same time, the reference signal, as output by a selected speaker 4 is picked up by microphone 8. A data regarding the reference signal is transmitted from microphone sound analysis unit 60 to control unit 70. The frequency response of the reference signal is measured in step S21 of FIG. 15. In step S22, display unit 73 of personal computer 7 displays the frequency response and the current network settings.

In step S23, the average intensity level of the low band of the frequency response profile is determined. If the average level of the low band is within the prescribed range of 70 dB–80 dB an OK signal is displayed on display unit 73, in step S24, to indicate to the user that low band levels do not need to be adjusted.

If the low band level is not within the prescribed range, whether the low band level is 70 dB or less is determined in step S25. If it is 70 dB or less, then display unit 73 displays an indication to the user that the gain level of the low band amplifier 3 needs to be increased at step S26. If the low band level is not 70 dB or less, then display unit 73 displays an indication to the user that the gain level of the low band amplifier 3 needs to be decreased at step S27.

In step S28, the average intensity level of the mid-range band of the frequency response profile is determined. If the average level of the mid-range band is within the prescribed range of 70 dB–80 dB an OK signal is displayed on display unit 73, in step S29, to indicate to the user that mid-range band levels do not need to be adjusted.

If the mid-range band level is not within the prescribed range, whether the mid-range band level is 70 dB or less is determined in step S30. If it is 70 dB or less, then display unit 73 displays an indication to the user that the gain level of the mid-range band amplifier 3 needs to be increased at step S31. If the mid-range band level is not 70 dB or less, then display unit 73 displays an indication to the user that the gain level of the mid-range band amplifier 3 needs to be decreased at step S32.

In step S33, the average intensity level of the high band of the frequency response profile is determined. If the average level of the high band is within the prescribed range of 70 dB–80 dB an OK signal is displayed on display unit 73, in step S34, to indicate to the user that high band levels do not need to be adjusted.

If the high band level is not within the prescribed range, whether the high band level is 70 dB or less is determined in step S35. If it is 70 dB or less, then display unit 73 displays an indication to the user that the gain level of the high band amplifier 3 needs to be increased at step S36. If the high band level is not 70 dB or less, then display unit 73 displays an indication to the user that the gain level of the high band amplifier 3 needs to be decreased at step S37.

In step S38, the average intensity level of the sub-woofer band of the frequency response profile is determined. If the average level of the sub-woofer band is within the prescribed range of 70 dB–80dB an OK signal is displayed on display unit 73, in step S39, to indicate to the user that sub-woofer band levels do not need to be adjusted.

If the sub-woofer band level is not within the prescribed range, whether the sub-woofer band level is 70 dB or less is determined in step S40. If it is 70 dB or less, then display unit 73 displays an indication to the user that the gain level of the sub-woofer band amplifier 3 needs to be increased at step S41. If the sub-woofer band level is not 70 dB or less, then display unit 73 displays an indication to the user that the gain level of the sub-woofer band amplifier 3 needs to be decreased at step S42.

The user is appropriately prompted at each stage of adjustment to adjust the gain of the appropriate power amplifier 3. When all power amplifiers 3 are adjusted the program terminates and the displays on display unit 73 are ended in step S38.

During adjustment of the gains of power amplifiers 3 the reference signal frequency response is displayed on display unit 73 of personal computer 7 in real time. At the same time, the user is prompted with the appropriate adjustment instruction and the next speaker is checked. The procedure allows the gain of power amplifiers 3 to be adjusted quickly and helps to insure that sound output will achieve intended results, for example, that the goal profile will be achievable.

In steps S26 and S27, steps S31 and S32, steps S36 and S37, step S41 and S42, messages such as "UP" and "DOWN" are displayed. However, it is understood that it is possible to generate corresponding audio messages with a voice-synthesized audio message so that the user does not need to look at display unit 73 while adjusting power amplifiers 3.

Entering or Changing Goal Profile

Figure 16:
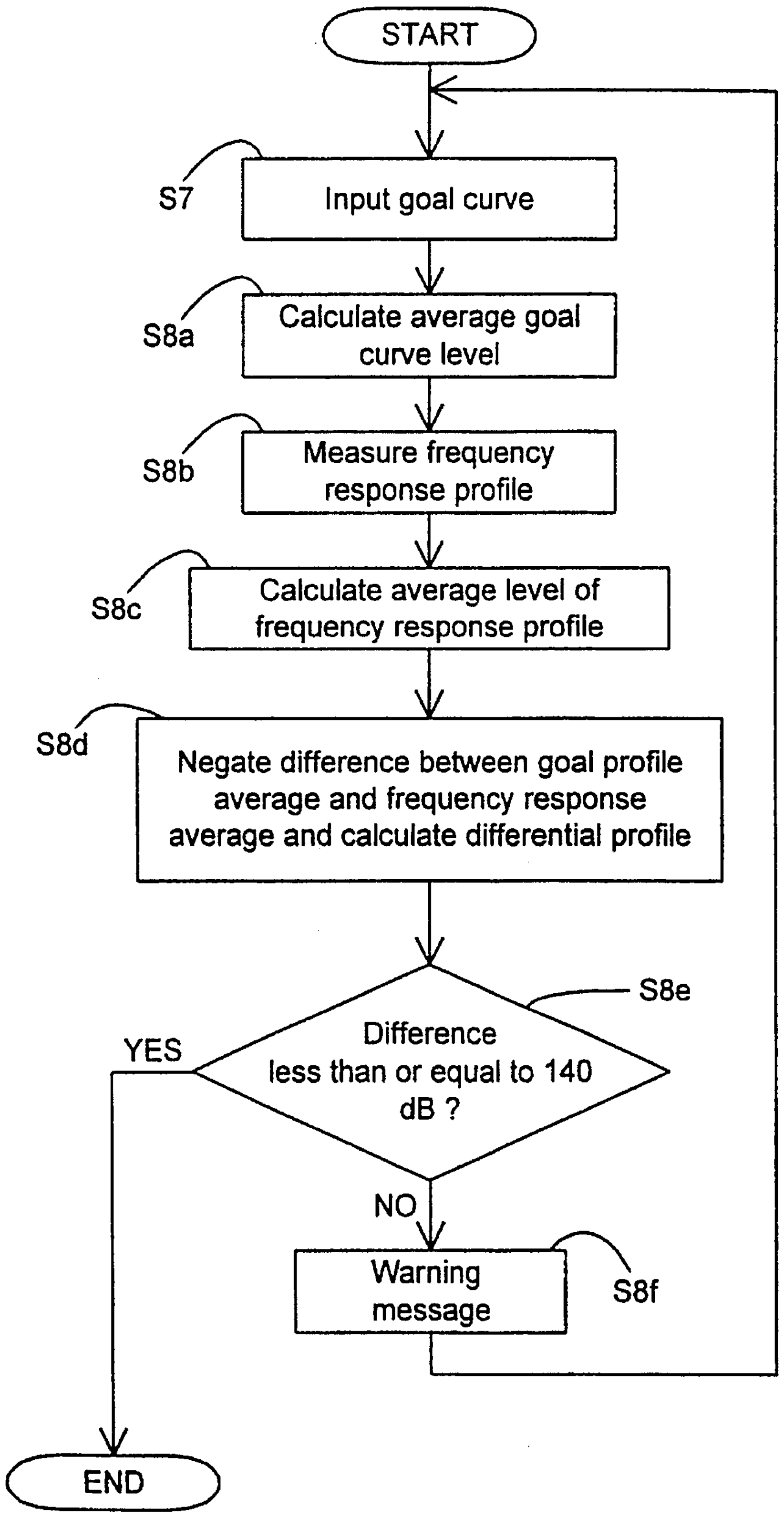
FIG. 16 is a flowchart showing a procedure for entering and validating a goal curve used by the digital signal processing unit of FIG. 2.

Referring now to FIGS. 4 and 16, the flowchart of FIG. 16 shows the details of a procedure for checking the validity of a goal profile. The procedure of FIG. 16 corresponds to steps S7 and S8 of FIG. 4.

Figure 17:
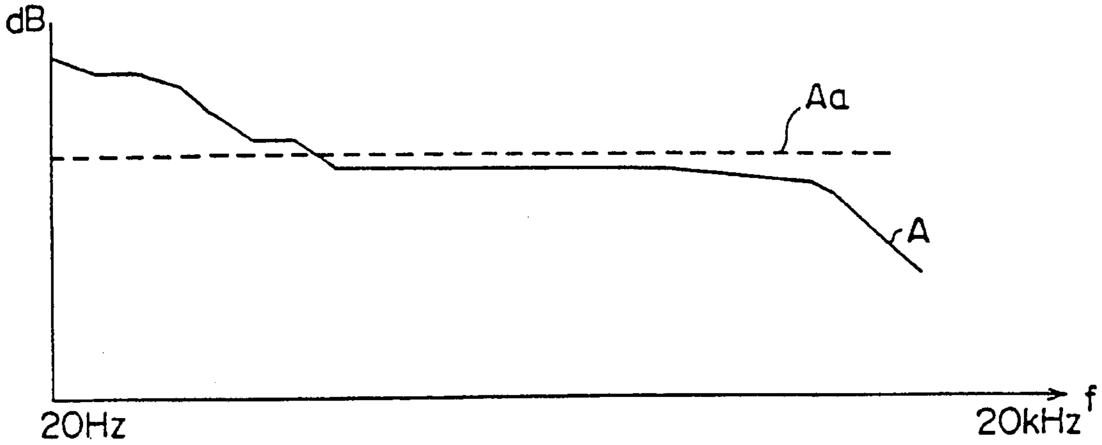
FIG. 17 is a diagram of a goal curve input by the procedure of FIG. 16.
Figure 18:
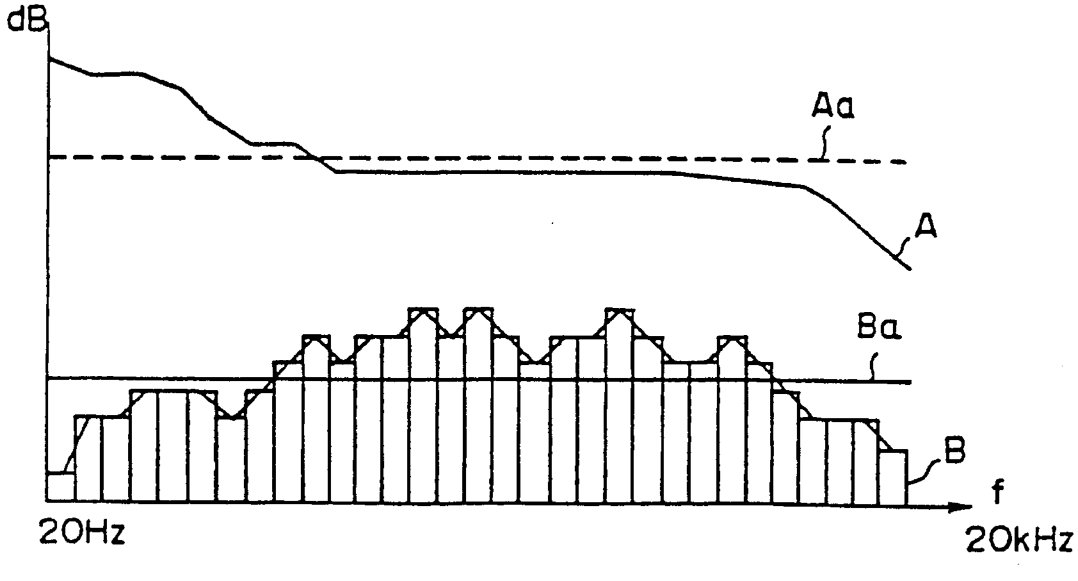
FIG. 18 is a diagram of a goal curve input by the procedure of FIG. 16 and a measured frequency response function measured by the audio analysis unit of FIG. 3.

Referring now also to FIGS. 16–18, K19*a* and K19*b*, as stated above with reference to FIG. 4, a new goal profile is input from key input unit 72 of audio analysis unit 5 in step S7 of FIGS. 4 and 16. Control then passes to step S8*a* (FIG. 16, only) where an average level for the goal profile is calculated. An example of a goal profile is graphed in FIG. 17. A solid line A represents the 31 values for each frequency band distinguished by parametric equalizer 21 that represent the goal profile. A broken line Aa represents an average value of the goal profile over the range of frequencies from 20 Hz to 20 kHz. The data for the goal profile and the goal profile level are stored in data storage unit 75 and displayed on display unit 73.

After step S8*a*, control passes to step S8*b* where the frequency response profile is measured. First reference signal generating unit 61 of audio analysis unit 5 outputs a reference signal through fiber optic cable 6*a* to digital signal processing unit 2. The reference signal is processed by digital signal processing unit 2, amplified by power amplifiers 3 and output through speakers 4. Microphone 8 picks up the sounds from speaker 4, and the resulting audio signal is applied to microphone sound analysis unit 60 of audio analysis unit 5. Microphone sound analysis unit 60 digitizes the signal from microphone 8 and calculates frequency response data constituting the frequency response profile. The average level of the frequency response profile is calculated in step S8*c* and the result transmitted to control unit 70. An example of a frequency response profile is graphed in FIG. 18 juxtaposed with the goal profile of FIG. 17. A solid line B and histograms represent the 31 frequency band values that represent the frequency response profile. A solid line Ba represents an average value of the frequency response profile over the range of frequencies from 20 Hz to 20 kHz. The data for the frequency response profile and the average value are stored in data storage unit 75 and displayed on display unit 73. Control then passes to step S8*d.*

Figure 19A:
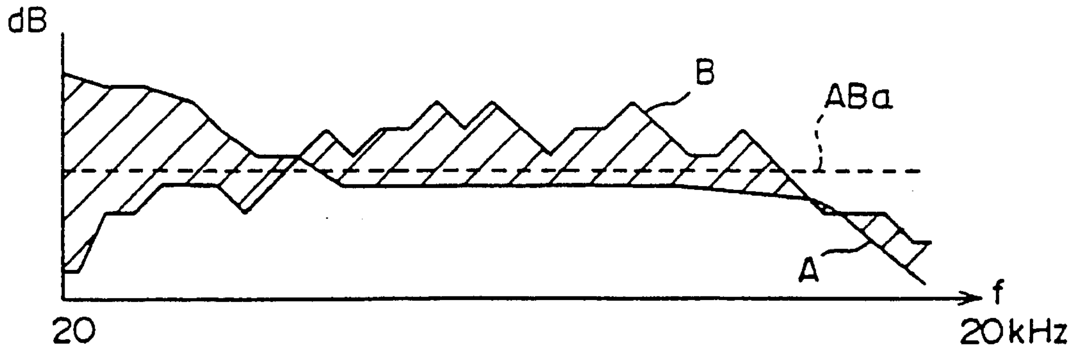
FIG. 19*a* is a diagram showing a step in a procedure for validating a proposed goal curve implemented by the procedure of FIG. 16.
Figure 19B:
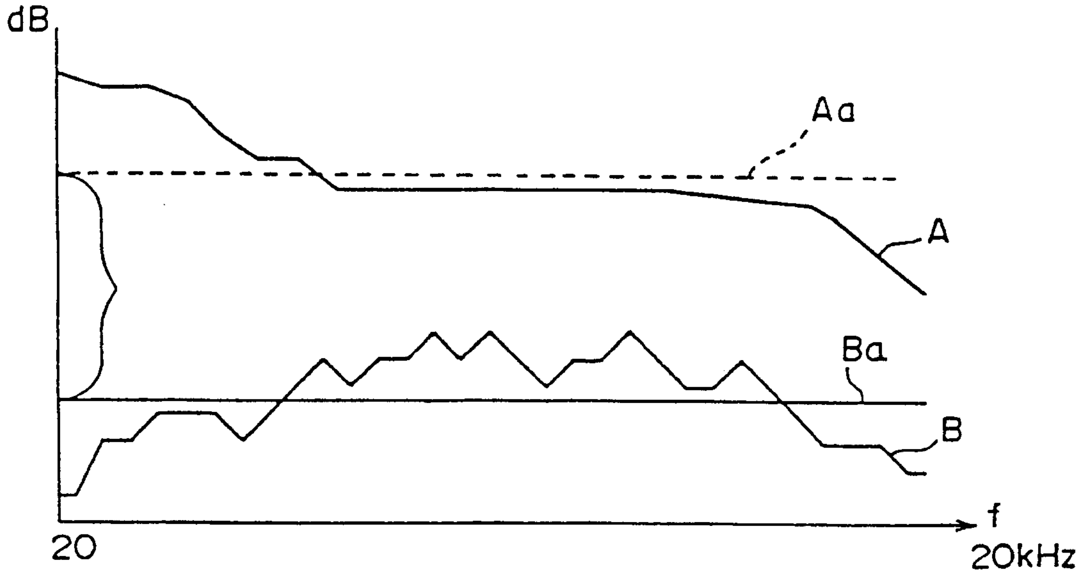
FIG. 19*b* is a diagram showing another step in the procedure for validating the proposed goal curve implemented by the procedure of FIG. 16.

Referring, now also to FIGS. 19*a* and 19*b*, in step S8*d*, the difference between the goal profile and frequency response profiles is calculated. The difference is eliminated by adding it to the lower one of the goal and frequency response profiles or subtracting it from the higher of the goal and frequency response profiles. Graphically, the result of the adding or subtracting is that one of the profiles is shifted toward the other so that there is zero difference between the two profiles on average, as shown in FIG. 19*b*. Next, the numerical integral of the absolute value of the difference between the two profiles is calculated to obtain the area between the two profiles, shown shaded in FIG. 19*b*. Next, control proceeds to step S8*e.*

In step S8*e*, the result of the numerical integral is compared to a specified value, 140 dB in the present case. If, the result is greater than 140 dB, a warning message requesting new goal profile data is displayed on display unit 73 in step S8*f.* In this case, the numerical value of the average level difference is also displayed. From step S8*f*, control returns to step S7 to permit the user to input another goal profile. If, in step S8*d*, the result of the numerical integral of is less than the specified value (140 dB), the program terminates.

The function represented by FIG. 16 permits a user to enter data representing a goal profile. The inputted goal profile is tested against the measured frequency response profile to determine if it is acceptable. If not, the user can enter another goal profile. The user can continue entering new goal profile data unit he is successful. At each turn, the user is shown a comparison of the new goal profile and the measured frequency response profile to help the user determine what new parameters will result in a numerical integral of the difference between the goal and frequency response profiles of less than 140 dB. The function of entering correct and correct goal profile data is enhanced and expedited by this feature of the invention.

Storing Goal Profile

When a new goal profile is entered into digital signal processing unit 2 and audio analysis unit 5, display unit 73 maintains a continuous display and print unit 74 prints out the new results and can also print out results during the inputting of goal profiles. Data storage unit 75 stores settings data and goal profiles on a floppy disk. The following description provides some details of the process of inputting goal profiles during steps S7 and S8 of FIG. 4. Of course, the procedure can be performed outside of the overall procedure of FIG. 4, or as part of any other suitable procedure.

Figure 20:
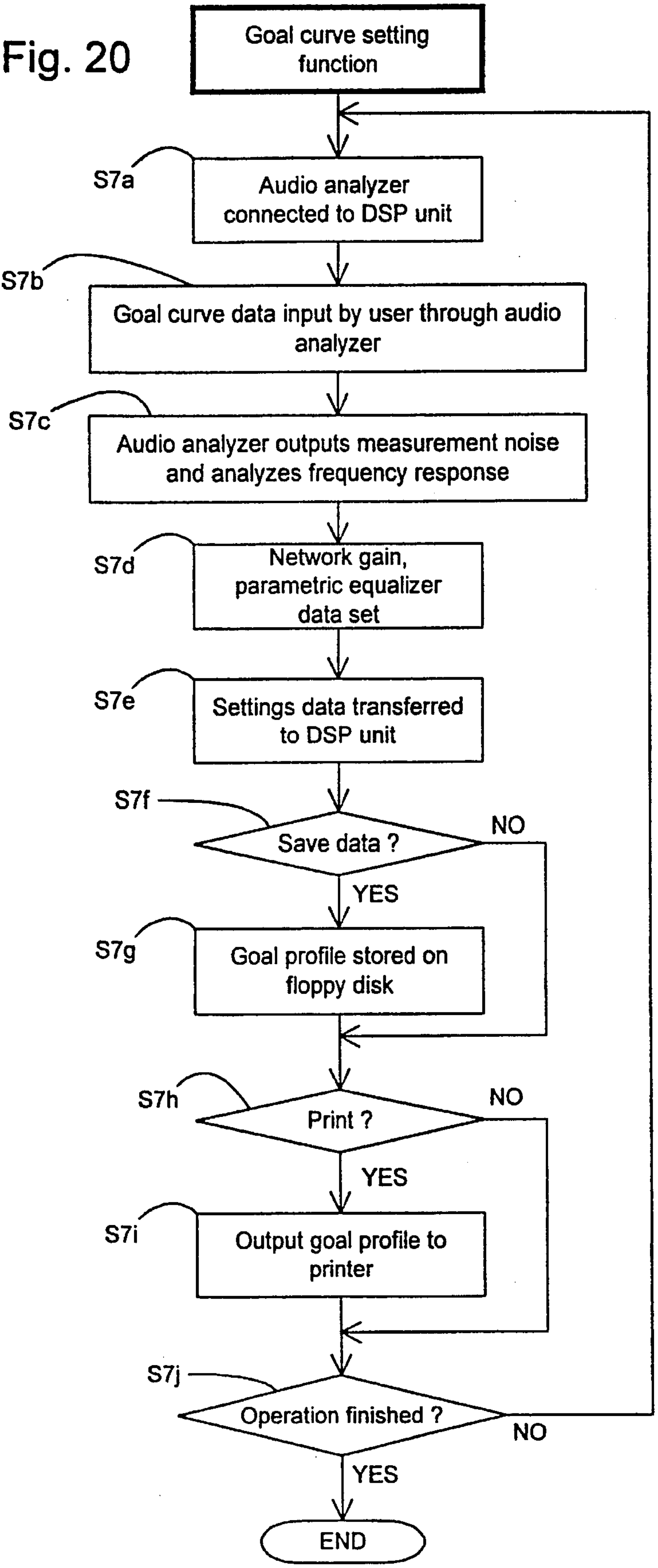
FIG. 20 is a flowchart showing a procedure for entering, displaying and storing a goal curve implemented by the audio analyzer unit of FIG. 3.

Referring to FIG. 20, the procedure for entering a new goal profile begins with connecting digital signal processing unit 2 with audio analysis unit 5 in step S7*a*, if it is not connected already. Next, at step S7*b*, the user enters a goal profile using key input unit 73 in personal computer unit 7. Then, in step S7*c*, the reference signal, generated by audio analysis unit 5, is sent to digital signal processing unit 2 and output by speakers 4. Audio analysis unit 5 receives the signal through microphone 8, and generates a frequency response profile. In step S7*d*, the settings data for digital signal processing unit 2, network gain, and equalizer data are derived from the frequency response data as described elsewhere in the present disclosure. The settings data are transferred to digital signal processing unit 2 in step S7*e*. Digital signal processing unit 2 stores the received settings data into backup memory 25 of digital signal processing unit 2.

Control proceeds to step S7*f* where the user is prompted to indicate whether to save goal profile data and the other settings. If the data is to be saved, it is recorded on a floppy disk in data storage unit 75 of personal computer 7 in step S7*g*. Control then proceeds to step S7*h*. If the user indicates the data are not to be stored on disk, control passes to step S7*h*.

Control then proceeds to step S7*h* where the user is prompted to indicate whether to print the goal profile data and the other settings. Printing of the goal profile is useful for checking the results of entry of the goal profile data. If the data is to be printed, it is printed by print unit 74 of personal computer 7 in step S7*i*. Control then passes to step S7*j*. If the user indicates the data are not to be stored on disk, control passes to step S7*j*. In step S7*j*, the user is prompted to indicate whether the goal profile input procedure is completed. If it is completed, the procedure terminates. If the user indicates the procedure is not finished, control returns to step S7*b*.

Note that a number of goal profiles and corresponding settings can be stored on disk. Each set of the profile and settings can correspond to a different kind of sound or "acoustic space." Thus, various "acoustic spaces" can be prepared and saved permitting them to be activated at will.

Since the settings data correspond precisely to the goal profile, since the settings are derived from them by the invention, the goal profile and the settings data can be stored as a unit on the floppy disk. After reading in the goal profile and confirming it on display unit 73, a single-keystroke command can cause one goal profile and attendant data to be set and activated.

Setting Relative Power amplifier Gains

In step S9, of FIG. 4, the gain of power amplifiers 3 (network gain) are adjusted. The following is a detailed description of a method and apparatus for accomplishing this. In essence, the method for automatically setting network gain attempts to minimize the discrepancy between the measured frequency response and the goal profile through adjustment of power amplifiers 3. Of course, the method and apparatus can be applied outside of the overall method shown in FIG. 4.

In the following description, as in the previous examples, it is assumed that gain adjustment is performed for power amplifiers 3 directed to front and rear speaker channels. Again, the front speakers are assumed to have four elements, requiring eight channels, one for each speaker 4 on each of the left and right sides. The rear speakers are assumed to have three elements, requiring six channels, one for each speaker 4 on each of the left and right sides. The front channels for each side are identified as sub-woofer, woofer, mid-range and high band channels corresponding to the four speaker 4 elements. The rear channels for each side are identified as woofer, mid-range and high band channels corresponding to the three speaker 4 elements of the rear speakers.

The cut-off frequencies for each of the divided bands are input in step S4 of the executive procedure of FIG. 4. The slopes of the gain-vs.-frequency profile at the boundaries of each of the bands are gently sloped so that drastic changes in speaker output for sounds near the boundaries is avoided.

Referring to FIGS. 4 and D6, a method for setting gains for the individual channels of the network corresponding to step S9 of FIG. 4. The method shown in FIG. D6 can be followed independently of that of FIG. 4. The method of FIG. D6 begins with measurement of the frequency response profile for the front and rear subsystems, respectively at step S1. In the method of FIG. 4, the frequency response profile is measured continuously in steps S3 through S12. Thus, the first step of FIG. D6 is not a separate step when the method is viewed as an expansion of step S9 of FIG. 4. The following discussion relates to the procedure independently of the other steps of FIG. 4.

Figure 21:
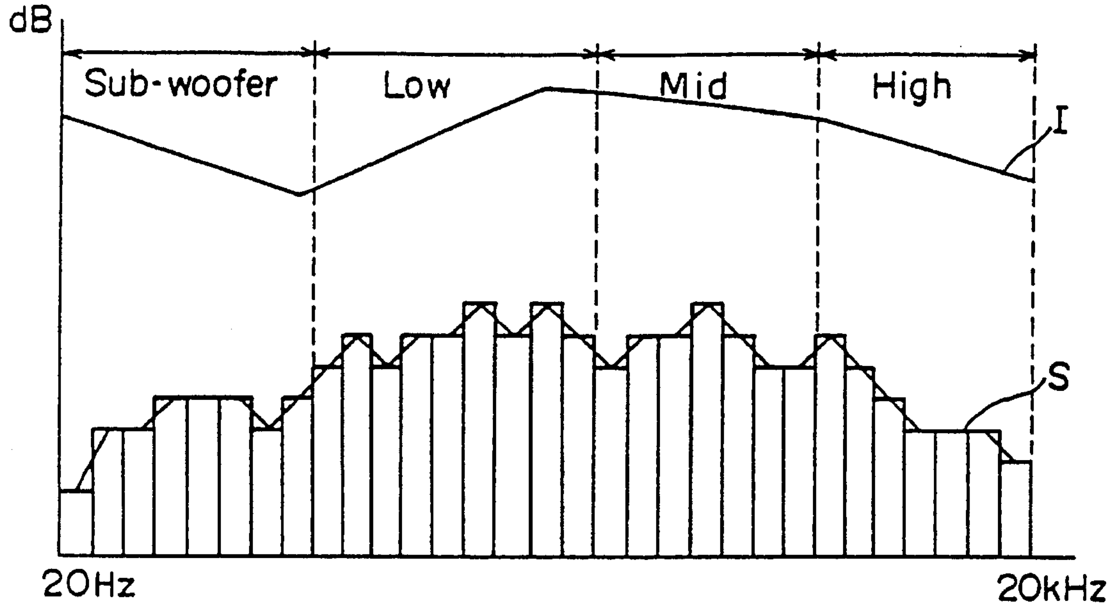
FIG. 21 is a diagram indicating a first step in a procedure for setting relative gain of different channels of a power amplifier of the audio adjustment system of FIG. 1.

Referring now to FIGS. 1–3, 21 and 26, a solid line I in FIG. 21 indicates an example goal profile corresponding to the front channels. An example measured frequency response profile is indicated by a solid line at S. The frequency range spanned by the profiles is 20 Hz to 20 kHz. The example profiles correspond to the front speakers which have four channels, one for the subwoofer, one each for the low, mid and high ranges. The cut-off frequencies are shown at the set points in the frequency spectrum.

Figure 22:
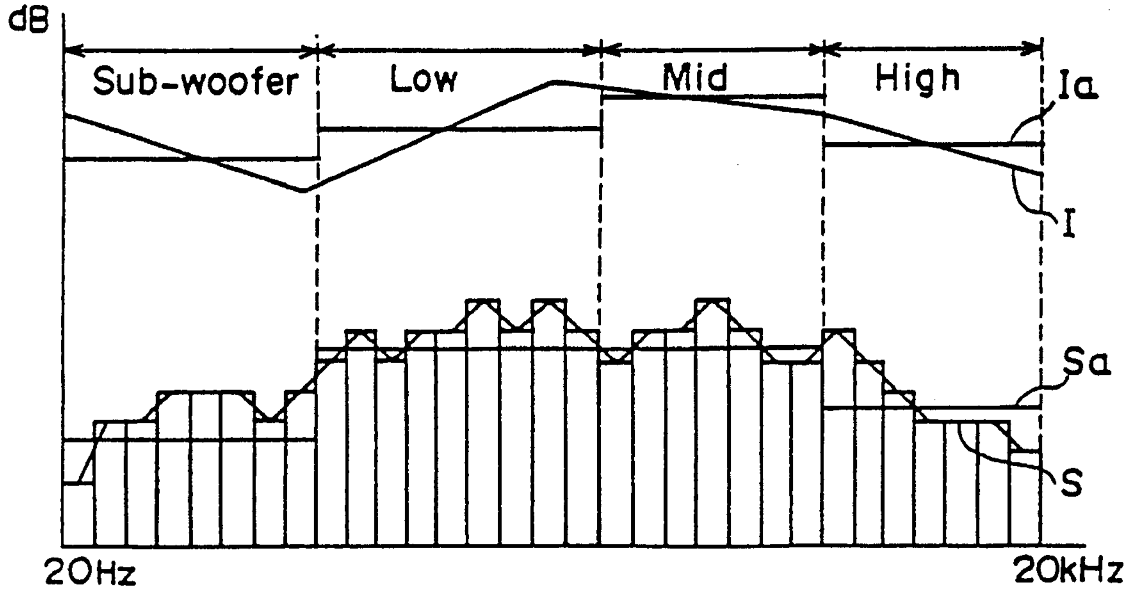
FIG. 22 is a diagram indicating second step in a procedure for setting relative gain of different channels of a power amplifier of the audio adjustment system of FIG. 1.

After the frequency response profile is measured in step S9*a*, average values of the goal profiles over each of the four frequency bands are calculated for the front channels and for the three frequency bands for the rear channels in step S9*b*. In other words, the average level of the goal profile in the interval extending from the lower boundary of a band to the upper boundary of the band is calculated for each band. Referring also to FIG. 22, the same information as in FIG. 21 is shown. In FIG. 22, superimposed on the information of FIG. 21, are the band-average levels for the example goal profile Ia, and band-average levels for the example measured frequency response profile Sa.

Figure 23:
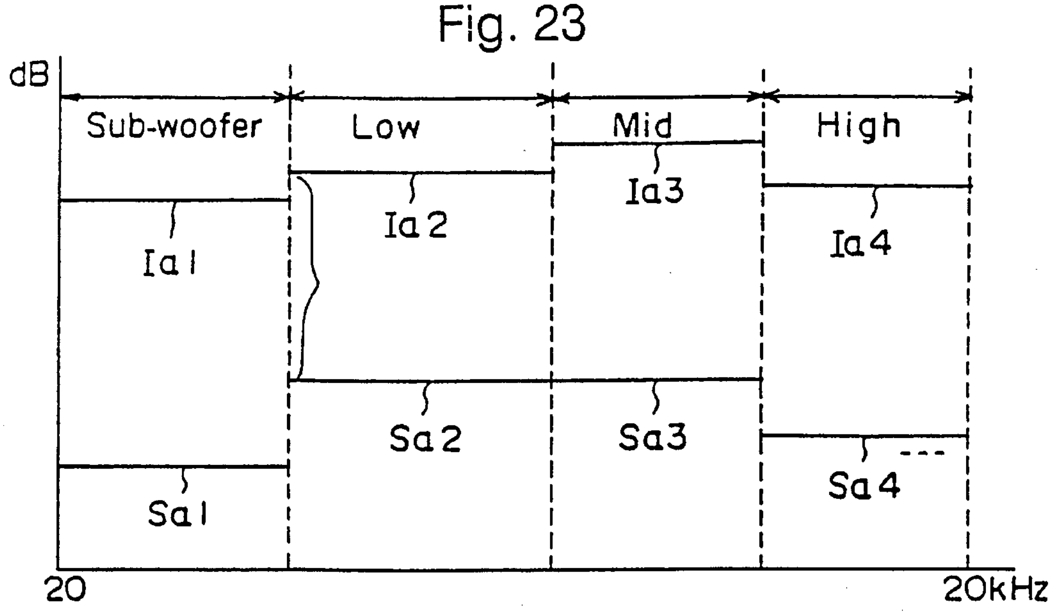
FIG. 23 is a diagram indicating third step in a procedure for setting relative gain of different channels of a power amplifier of the audio adjustment system of FIG. 1.
Figure 24:
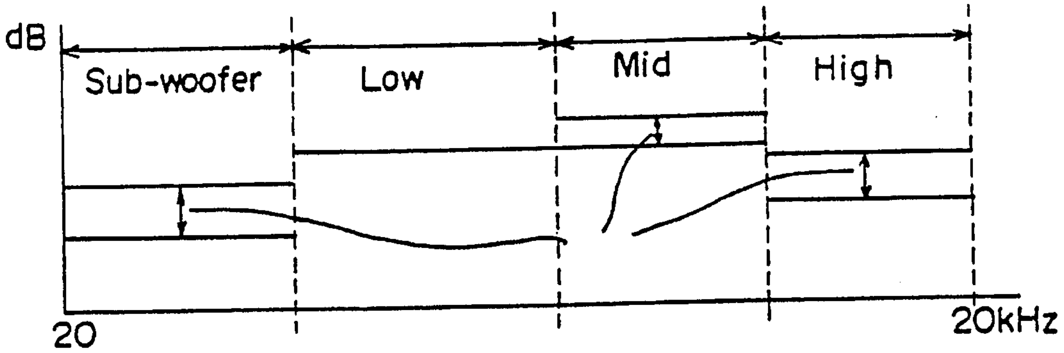
FIG. 24 is a diagram indicating a fourth step in a procedure for setting relative gain of different channels of a power amplifier of the audio adjustment system of FIG. 1.

After step S9*b*, control passes to step S9*c*, where the averages for each band of the frequency response profile are calculated. Control then passes to step S9*d* where the difference between the average level of one of the frequency profile bands and the average level of a corresponding one of the goal profile bands is calculated. Referring also to FIGS. 23 and 24, the difference is added or subtracted from the band-average profiles Ia and Sa to numerically cancel the difference between the goal and frequency response profiles of the one band. In FIG. 23, this operation is shown graphically. The band-average profiles Ia and Sa (the step-shaped functions representing the averages for each band) are shifted until the averages for one of the bands (in this case, the low band) coincide. The shifted profiles are shown in FIG. 24.

Next, control passes to step S9*e* where the differentials between the average values of the goal profile and the average values of the frequency response profile for the remaining bands are calculated, the data for these network gain values are sent from digital signal processing unit 2 to audio analysis unit 5, entered as new network gain values. The same procedure is performed for the rear channels. Control then proceeds to step S9*f*.

Figure 25:
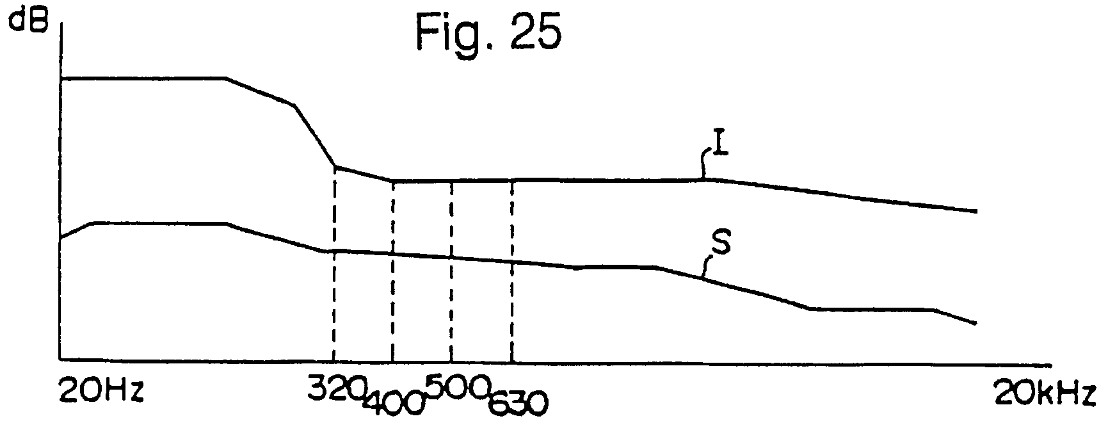
FIG. 25 is a diagram indicating a fifth step in a procedure for setting relative gain of different channels of a power amplifier of the audio adjustment system of FIG. 1.
Figure 26:
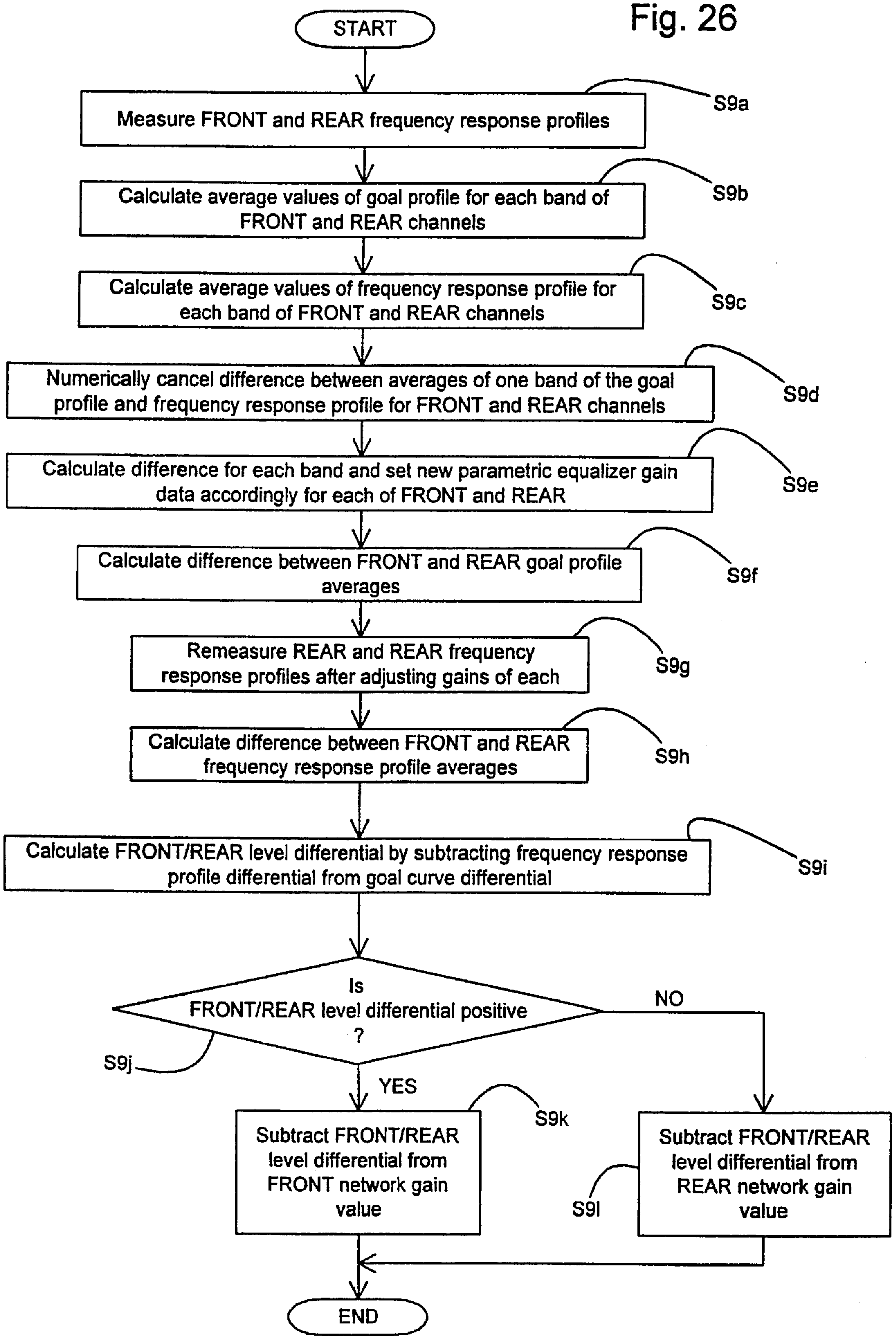
FIG. 26 is a flowchart showing a procedure for setting relative gains of different channels of a power amplifier of the audio adjustment system of FIG. 1.

In step S9*f*, the differential between the goal profiles for the front and rear sides is derived. This difference, however, is calculated from averages of the sound intensity at four frequencies lying in the mid-range. This is because the average level may be overly affected by the differences in emphasis between the low-range and high range output of the front and rear speakers. It is more realistic to make a comparison of average levels at the mid-range, which can be heard clearly by the human ear. Referring also to FIG. 25, in the present embodiment, an average of the sound intensities at 320 Hz, 400 Hz, 500 Hz and 630 Hz is calculated from the goal profiles. In step S9*g*, the difference between the goal profile front average (GFA) and the goal profile rear average (GRA) is then calculated to obtain a Front/Rear Goal Differential (FRGD).

$$FRGD=GFA-GRA. \quad (1)$$

Next, in step S9*g*, the frequency response is measured again. This is done after the gains for the front and rear channels were adjusted in order to account for the effect of adjusting the gains of amplifiers 3 respecting the frequency bands. Then, in step S9*h*, the difference between the average frequency response profiles for the front and rear channels is calculated. Again, the average of the measured frequency response profiles is taken to be the average of the sound intensities at 320 Hz, 400 Hz, 500 Hz and 630 Hz. The difference between the Measured front-channel frequency response profile average and the measured rear-channel frequency response profile average is calculated in step S9*h* to obtain a Front/Rear Measured Differential (FRMD):

$$FRMD=MFA-MRA. \quad (2)$$

Finally, in step S9*i*, the two differentials are subtracted to obtain a measured-goal differential which is used to again change the gains of amplifiers 3. The measured-goal differential (MGD) is given by:

$$MGD=FRMD-FRGD. \quad (3)$$

Next, control proceeds to step S9*j*. Control passes from step S9*j* to step S9*l* if the measured-goal differential is negative. If the measured-goal differential is positive, control passes to step S9*k*. In step S9*l*, the measured-goal differential is subtracted from the gains of all of the front power amplifiers 3. In step S9*k*, the measured-goal differential is added to the gains of all of the front channel power amplifiers 3. After steps S9*k* or S9*l*, the procedure terminates.

The new front/rear network gain values derived according to the this procedure are used by network adjustment unit 22 and digital signal processing unit 2. The new gain values are recorded in back-up memory 25 of digital signal processing unit 2, and at the same time stored in data storage unit 75 of audio analysis unit 5. Again, the backup storage of the data permits this data to be restored if the contents of back-up memory 25 are lost.

Frequency Response and Channel-Average Displays

Referring to FIGS. 27 and 1, a flow chart shows an embodiment of a frequency response analysis procedure of the present invention. The frequency response analysis procedure is performed by personal computer 7 and analyzer unit 6 functioning in conjunction with digital signal processing unit 2. The procedure begins with a user being prompted at step S11*a* to connect analyzer unit 6 to digital signal processing unit 2. Following the connection of analyzer unit 6 to digital signal processing unit 2, the program proceeds to step S11*b* wherein the user is prompted to select between a frequency properties display or an average signal level display. The frequency properties display option provides the user with a display of average signal levels in a plurality of frequency bands covering the audio spectrum. This permits the frequency response of the system to be determined. Alternatively, if the frequency properties display option is not chosen, the procedure performs measurements of average signal levels averaged across the entire audio spectrum instead of sub-bands thereof. These measurements are directed toward determining the average output of front and rear and left and right channels.

If the frequency properties display option is selected, the program prompts the user to select whether a frequency properties display of the front or rear channels is desired. At step S11*c* the program determines whether the user has selected a display of the frequency properties of the front channels or the rear channels. If the display of the front channels' frequency properties has been selected, frequency response measurement steps S11*d*–S11*g* are executed, and by default, if the front speaker option was not selected, frequency response measurement steps S11*h*–S11*k* are executed for measurement of the frequency response of the rear speakers.

The frequency response measurement steps, S11*d*–S11*g* and S11*h*–S11*k*, each include four steps wherein sound is generated by front and rear units of the 4, respectively, and then measured. In the first step, S11*d* and S11*h*, personal computer 7 passes a command to digital signal processing unit 2 instructing it to generate a measurement noise signal to be output by the respective front or rear speakers 4. Furthermore, the noise signal generated alternatively drives left and right units of the front or rear speakers 4 permitting measurement of a response for the individual left and right channels. The measurement noise signal in the present embodiment is pink noise, however, it is clear that other noise spectra or swept frequency signals may be similarly employed. Once digital signal processing unit 2 has received the command, digital signal processing unit 2 generates waveforms in steps S11*e* and S11*i* to produce pink noise which are output to amplifiers 3 and either front or rear units of speakers 4. The pink noise produced by speakers 4 serves as a known reference for determination of the frequency response. In steps S11*f* and S11*j* microphone 8 receives the pink noises generated by speakers 4 and transmits a received noise signal to microphone sound analysis unit 60 of analyzer unit 6. Finally, in steps S11*g* and S11*k*, microphone sound analysis unit 60 determines a average signal levels in each of 31 frequency bands covering the audio frequency spectrum. These levels are then transmitted to control unit 70 of personal computer unit 7.

Referring to FIGS. 1 and 28*a*–28*d*, the average signal level of each of the 31 frequency bands are displayed, during steps S11*g* and S11*k*, on display unit 73 in a bar graph as shown. In the bar graph, the left and right channels are represented by adjacent bars distributed over a horizontal axis representative of the audio frequency spectrum. The bar graph gives the user a pictorial representation of the frequency response of the system permitting the user to adjustments to redefine the response. The bar graph illustrated shows a relatively flat frequency response with the left channel having lower gain than the right channel across the frequency spectrum.

Referring again to FIG. 27, if the user has not selected a display of the frequency properties at step S11*b*, the program defaults and proceeds to branches for measuring average signal level taken over the entire audio spectrum. After a negative determination at step S11*b*, the program prompts the user to select average signal level measurement of either the left and right channels or the front and rear channels combined. At step S11*l* the program examines the user input at step S11*l* for an indication of whether a left and right signal level display has been chosen. If a left and right signal level display has been selected, it is then determined in step S11*m* whether the user has requested that the signal levels of front speakers 4 be displayed. If front speakers 4 have been selected, left and right front speaker measurement steps S11*n*–S11*q* are executed, alternatively, the program defaults to execution of left and right rear speaker measurement steps S11*r*–S11*u*.

The left and right/front and rear measurement steps, S11*n*–S11*q* and S11*r*–S11*u*, are similar to the frequency response measurement steps, S11*d*–S11*g* and S11*h*–S11*k*, discussed above with the exception of the analysis applied by microphone sound analysis unit 60. Microphone sound analysis unit 60 measures an average signal level across the full audio spectrum instead of measuring an average signal level in a given one of the 31 frequency bands. Therefore, in steps S11*o* and S11*s*, pink noise is alternately output by left and right speakers in the front and rear, respectively, and is received by microphone 8 and analyzed by analyzer unit 6 in steps S11*p* and S11*t*.

Figure 28:
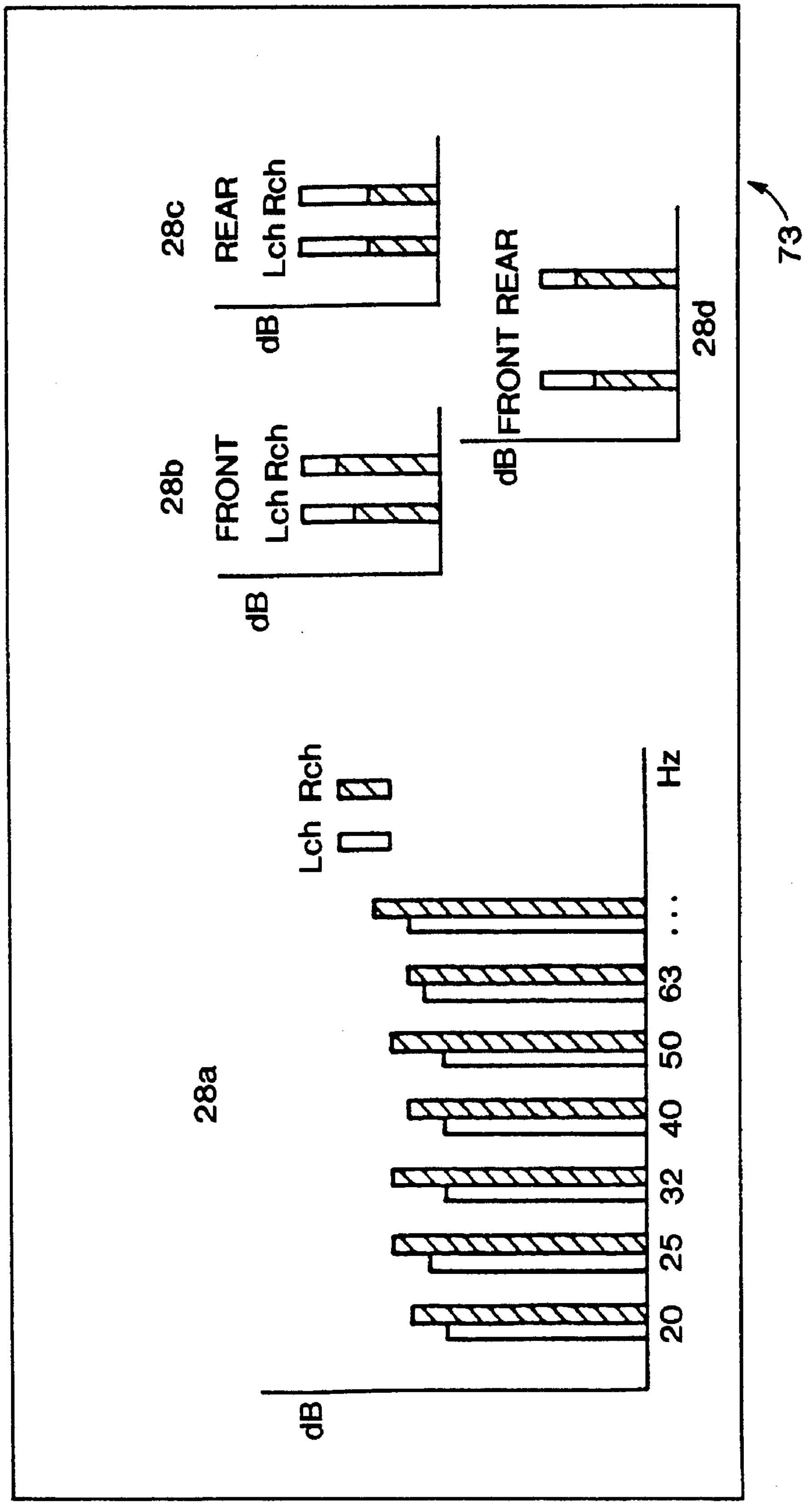
FIG. 28 is a diagram of the display generated by the procedure of FIG. 27.

Referring to FIG. 28*b* 28*c*, the average signal levels for the front and back channels, respectively, are displayed by display unit 73 in steps S11*q* and S11*u*. The front right channel is shown to be at a slightly higher level than the front left channel in FIG. 28*b*. The left and right rear channels are substantially equal in level in FIG. 28*c* and below the levels of the left and right front channels in FIG. 28*b*. Display unit 73 may employ various display technologies, such as LCD's, electroluminescent displays, or a CRT.

Referring back to FIG. 1, 3 and 27, if the user has not selected a display of the left and right signal level, the inquiry at step S11*l* is answered in the negative and the program branches to front and rear signal level measurement steps S11*v*–S11*y*. The front and rear signal level measurement steps S11*v*–S11*y* are similar to the left and right/front and rear measurement steps, S11*n*–S11*q* and S11*r*–S11*u*, described above with the exception that an average combined signal level of the front speakers 4 and an average combined signal level of the rear speakers 4 is measured in place of left and right independent signal levels. Thus, at step S11*w*, speakers 4 alternatively emit pink noise from front and rear units. Microphone 8 picks the sound of speakers 4 in step S11*x* and transmit a corresponding signal to analyzer unit 6. Analyzer unit 6 computes the average signal level across the audio spectrum for the front and back speakers 4. Analyzer unit 6 then transmits the average signal level information in step S11*y* to personal computer 7 to display the data on display unit 73.

Referring to FIG. 28*d*, a bar graph displays the average signal levels of the front and rear channels. The rear channel is shown having a slightly higher level than the front channel. The use of bar graphs is illustrated in FIGS. 28*a*–28*d* it is understood that other display methods of may be employed to communicate the levels measure by analyzer unit 6.

The steps discussed above permit a user to obtain a graphical representation of the acoustical response of audio unit 110 being tested. The frequency response of the left and right channels of both the front and rear can be displayed. Furthermore, the average signal levels of the left and right channels of both the front and rear channels is displayable. Finally the average signal level of the combined front channels is displayable along with the average signal level of the combined rear channels. The display of these signal levels permits the user to enter correction data into digital signal processing unit 2 via personal computer 7 which may specifically tailor or equalize the acoustical response of audio unit 110.

Following the completion of a series of measurement steps displaying signal level data, the programs prompts the user at step S11*z* to input whether the signal level data is to be stored in data storage unit 75 of personal computer 7. Data storage unit 75 includes at least one permanent storage means, for instance, a hard disk drive or a floppy disk drive. If the program receives a positive response at step S11*z*, the flow proceeds to step S11*aa* wherein the signal level data is stored. The program next proceeds at step S11*ab* to prompt the user to input whether a print-out of the signal level data is required. A positive response results in the signal level data being printed out at step S11*ac* by print unit 74. Finally, the program prompts the user at step S11*ad* to input whether further measurements are desired. If the user indicates that additional measurements are to be made, the program returns to step S11*b* wherein the user is prompted to choose between frequency property measurements and average signal level measurements as discussed above. Alternatively, if the user is finished the program ends.

In summary, the present invention provides a method of acoustic measurement wherein audio unit 110 may be adjusted, with the aid of computer driven measurements, to provide an ideal frequency response and sound distribution in a given environment. The program discussed above controls the computer driven measurements, thus quickly providing comprehensive data required for tailoring a response of audio unit 110. The measurements are performed by generating a reference audio signal comprising pink noise. The reference audio signal is selectively applied the left front, right front, left rear, or right rear channels, or combinations thereof, and resultant audio outputs are received by microphone 8 and analyzed by analyzer unit 6. The results are displayed in real-time permitting settings to be input to digital signal processing unit 2 for the purpose of optimizing the audio unit response. Digital signal processing unit 2 digitally implements acoustic corrections which modify the analog outputs of the D/A converters, 26–29, permitting accurate and rapid optimization of the response of audio unit 110.

Storing Comment Data

In addition to the acoustic correction adjustment data, data storage unit 75 in personal computer 7 of audio analysis unit 5 also records comment data. The comment data can include information such as the shop of the person who performed the adjustment of the audio system. In addition, the comment data can include the date of the last adjustment and/or other data deemed critical.

When audio analysis unit 5 transfers equalizer data and other adjustment data to digital signal processing unit 2, comment data is also transferred at the same time. The adjustment data and the comment data are recorded in back-up memory 25 of digital signal processing unit 2. The adjustment data recorded in back-up memory 25 can be overwritten or deleted by the user directly through input device 1*c*. In the preferred embodiment, however, comment data can only be deleted or overwritten through audio analyzer unit 5.

Figure 29:
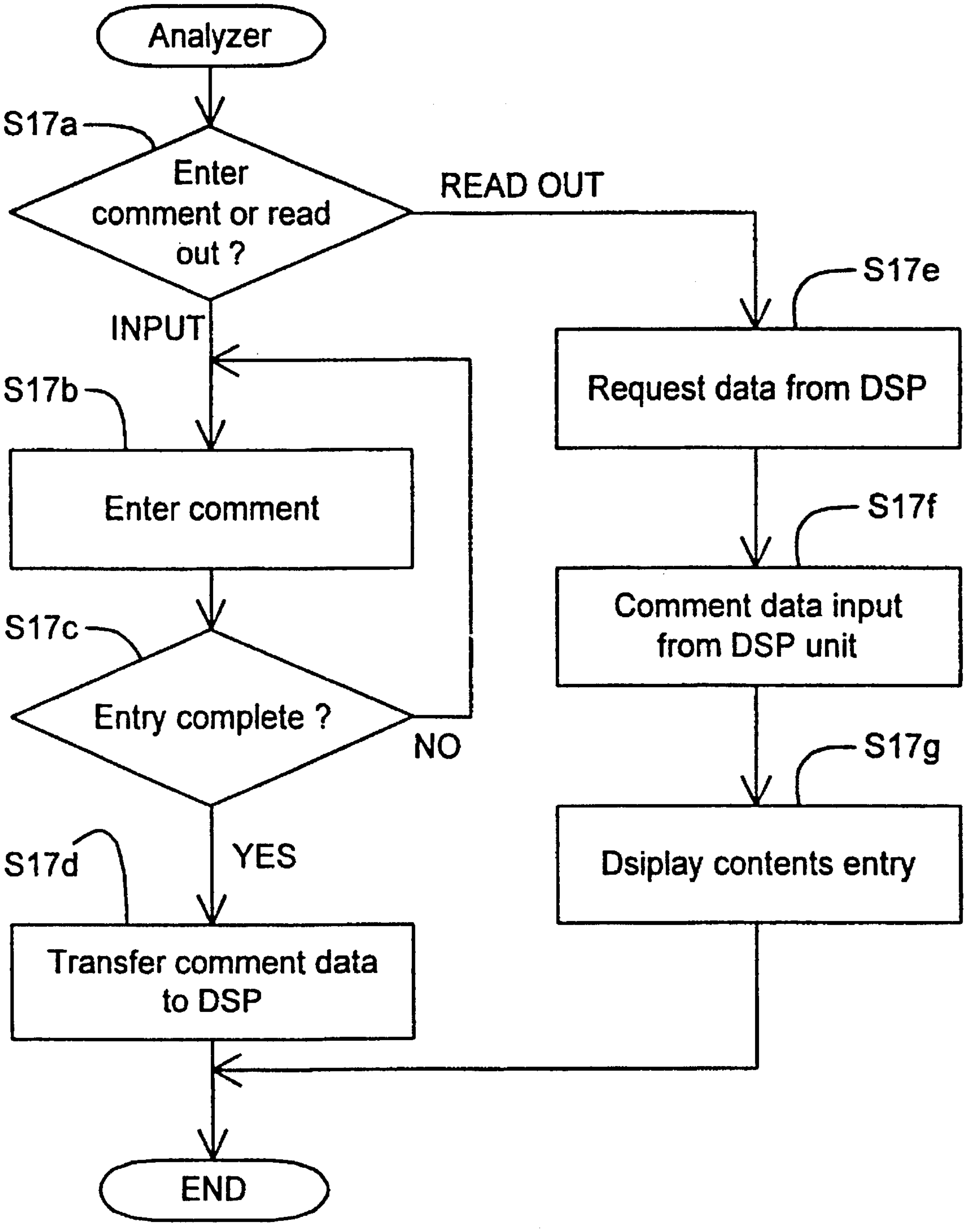
FIG. 29 is a flowchart showing a procedure for entering and storing comment data which is stored in the digital signal processing unit of FIG. 2.

Referring to FIG. 29, a procedure for selectively entering and examining comment data in digital signal processing unit 2 begins with step S17*a*. In step S17*a*, the user enters a command, through key input unit 72, to enter a comment or retrieve a comment already stored in digital signal processing unit 2. If comment data is to be entered, control proceeds to step S17*b*. If comment data already stored in backup memory 25 of digital signal processing unit 2 is to be read out, control proceeds to step S17*e*. In step S17*b*, comment data is entered through key input unit 72 and temporarily stored in the memory of personal computer unit 7. Control moves to step S17*c* from step S17*b* where the user is prompted to indicate whether the user is finished entering comment data. If the user indicates there user is finished entering comment data, the comment data is transferred to digital signal processing unit 2 in step S17*d* via control line 7*a*.

If, at step S17*a*, comment data is to be retrieved from digital signal processing unit 2, data indicating a request for comment data retrieval is sent to digital signal processing unit 2 at step S17*e*. At step S17*f*, in response to the request, comment data is transferred from digital signal processing unit 2 to personal computer 7 over control line 7*a*. In step S17*g*, the comment data are displayed on display unit 73 of personal computer 7.

Figure 30:
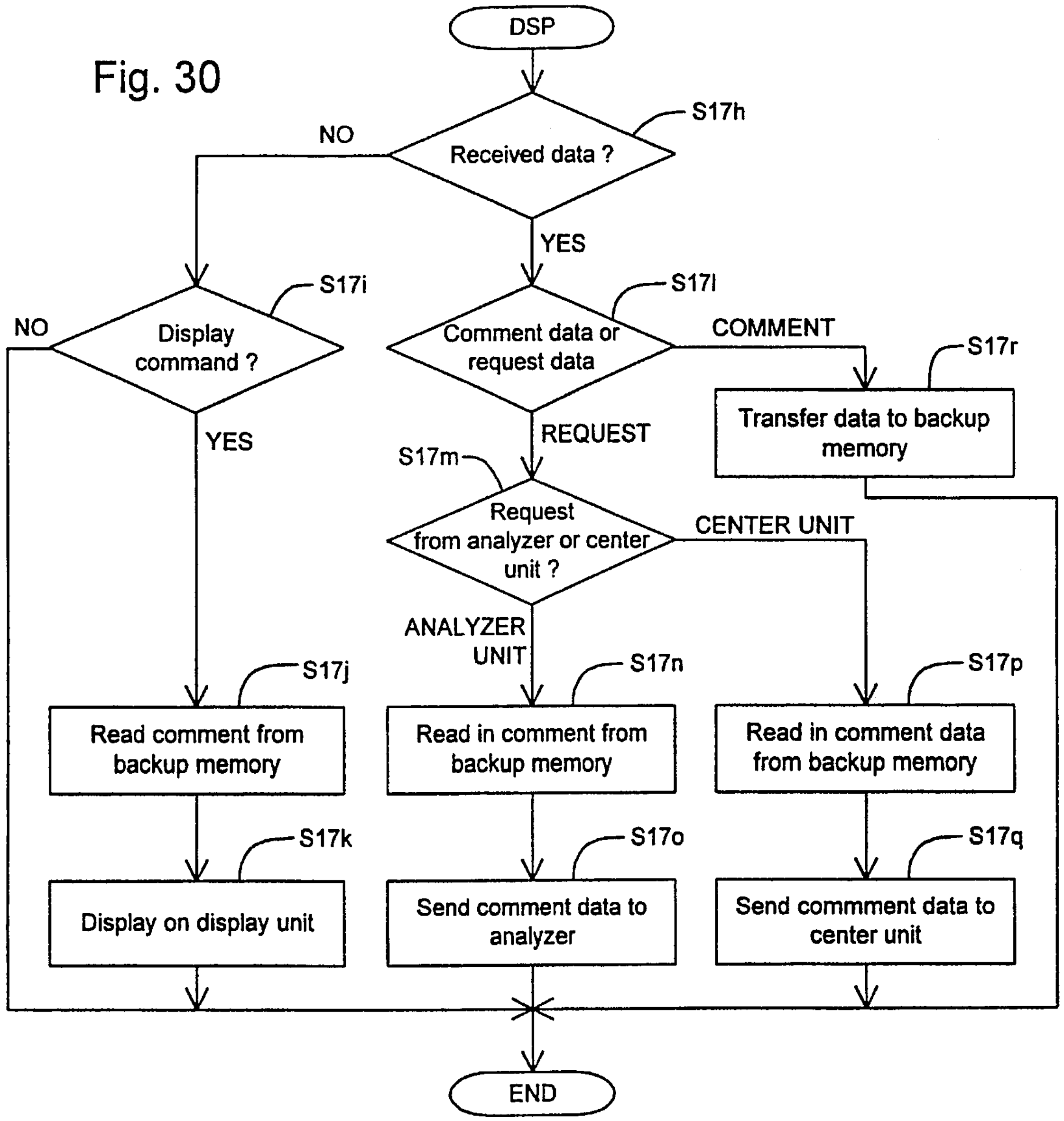
FIG. 30 is a flowchart showing a procedure for retrieving and displaying comment data stored in the digital signal processing unit of FIG. 2.

Referring now to FIG. 30, a procedure followed by microprocessor 24 of digital signal processing unit 2 responds to command signals from audio analysis unit 5 to transfer comment data to center unit 1 or audio analysis unit 5 or to display comment data on display unit 24*a*. The procedure begins in step S17*h* by determining whether command data is present on control line 7*a*. If command data is not present, control passes to step S17*i*. In step S17*i*, microprocessor 24 determines if the command is a display command. If it is a display command, control passes to step S17*j* where microprocessor 24 retrieves the comment data stored in back-up memory 25. Next, in step S17*k*, the retrieved comment data is displayed on display unit 24*a*.

If command data is not present at step S17*h*, control passes to step S17*l* where microprocessor 24 determines whether the data is request data or comment data from audio analysis unit 5. If it is request data, control passes to step S S17*m* where microprocessor 24 determines whether the request data is from audio analysis unit 5 or center unit 1. If it is from audio analysis unit 5, control passes to step S17*n* where the comment data, stored in back-up memory 25, is retrieved. Next, in step S17*o*, the retrieved comment data is transmitted to audio analysis unit 5. If, in step S17*m*, the data is determined to be from center unit 1, the comment data stored in back-up memory 25 is retrieved at step S17*p*, and the retrieved comment data sent to center unit 1 at step S17*q*.

If, at step S17*l*, the data is determined to be comment data, the comment data is stored in back-up memory 25 at step S41.

Referring to the flowchart in FIG. 7, the following is a description of the operations of center unit 1 relating to the comment data.

Figure 31:
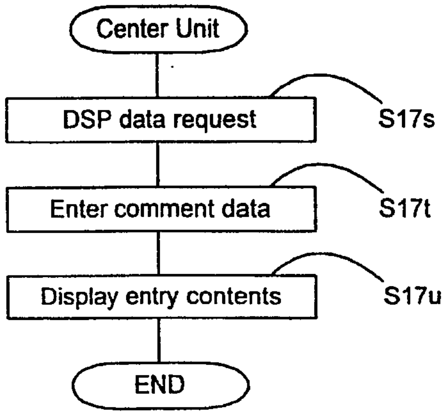
FIG. 31 is a flowchart showing a procedure for retrieving and displaying, on a display of the center unit of the audio system of FIG. 1, comment data stored in the digital signal processing unit of FIGS. 1 and 2.

Referring now to FIG. 31, a procedure performed by center unit 1 displays comment data on display unit 1*e* of center unit 1 responsively to data transferred from digital signal processing unit 2. In step S17*s*, a request command is sent from center unit 1 to digital signal processing unit 2. The request could be automatic or sent responsively to the a command entered by the user through input device 1*c*. If comment data is received from digital signal processing unit 2, the comment data is entered at step S52, and it is displayed on the display unit (not indicated in the drawing) of center unit 1.

The above procedures make it possible for the user to obtain the comment data stored in backup memory 25 even if the adjustment data is erased. This is done by displaying the comment data on display unit 24*a* via prescribed user commands. If the comment data is arranged to include the tuning shop and the specialist who performed the previous adjustments, the user can still recover this information. By looking to the former specialist who may have the previous adjustment data stored on disk and who may have an audio analysis unit 5 to restore those settings to digital signal processing unit 2, the system may be readjusted to its former settings.

In the embodiment described above, digital signal processing unit 2 has the ability to display data on display unit 24*a*. However, even if digital signal processing unit 2 did not have a display function, it is still possible to display information on the display unit in center unit 1. With the automatic adjustment system of the present invention, comment data can be displayed in response to prescribed user-entered commands. This permits the user to retrieve the name of the tuning shop by looking at the comment data, rather than having to refer back to his records. If the acoustic correction data stored in backup memory 25 of digital signal processing unit 2 is lost, the user can contact the adjuster to restore the previous settings data which are stored on disk.

Summary

The time required to make adjustments to the various audio parameters using the method and apparatus described is approximately 30 minutes. In addition to requiring less time than conventional methods and apparatus, the results are more uniform than manual adjustment with reliance on human hearing. This is because the results are not affected by the skill or the personal biases of the user making the adjustments. Furthermore, if the acoustic correction data stored in memory is lost, the acoustic correction adjustments can be restored from the data stored in data storage unit 75 of personal computer unit 7.

While the above description of the embodiment pertained mainly to adjustments of frequency properties of audio signals in an automobile, the present invention can also be used to automatically set up acoustic correction data for a concert hall, a live stage or the like.

According to the embodiments and methods of the present invention, a reference audio signal is generated by an acoustic correction system and output from a speaker of an audio system. A microphone picks up the signal and apparatus of the invention analyzes it. The results of the analysis are used to adjust automatically the acoustic correction performed by the audio system's internal acoustic correction system. This allows uniform adjustments to be made rapidly. If acoustic correction data is lost, correction data stored permanently as a back up data file can be restored to the system.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An automatic adjustment system for audio devices comprising:

a memory for storing equalizer data;

an audio device having programmable equalizer means for selectively modifying an audio output thereof according to said equalizer data;

an audio signal analyzer having means for generating a reference signal;

said audio signal analyzer being connectable to at least one of said programmable equalizer means and said audio device;

said audio device including means for generating an audible output responsively to said reference signal;

said audio signal analyzer having a means for storing a goal profile indicative of a desired frequency response of said means for generating an audible output;

said audio signal analyzer including means for comparing said audible output with said goal profile: and means for automatically adjusting said equalizer data responsively to a result of said comparing.

2. Apparatus as in claim 1, further comprising:

means for printing out data corresponding to said equalizer data; and means for displaying said data corresponding to said equalizer data.

3. Apparatus as in claim 1, further comprising nonvolatile storage means, connectable to said audio signal analyzer, for storing said goal profile and a result of said adjusting.

4. Apparatus as in claim 1, further wherein:

said means for comparing includes a microphone connectable with said audio signal analyzer;

said audio signal analyzer includes means for displaying a result of said comparing;

said memory includes means for storing channel gain data;

said audio device includes a multichannel amplifier;

channels of said multichannel amplifier each having a respective gain;

means for setting each of said respective gains responsively to said channel gain data; and means for setting each of said respective gains responsively to said result of said comparing.

5. Apparatus as in claim 4, further comprising:

said equalizer means including means for dividing said output into a plurality of frequency subbands;

said equalizer means including means for selectively amplifying each said frequency subbands;

first and second ones of said channels;

each of said subbands together with at least another of said subbands forming one of a plurality of bands, each consisting of a contiguous range of frequencies defined by a lower cutoff frequency and an upper cutoff frequency;

means for selectably directing each of said bands to a corresponding one of said first and second channels;

an output of said first and second channels;

means for detecting a frequency response of said output;

means for generating a real-time histogram-type display of said frequency response; and means for graphically displaying said lower cutoff frequency and said upper cutoff frequency of each of said bands with said histogram-type display.

6. Apparatus as in claim 4, further comprising:

a floppy disk drive of said audio signal analyzer;

said floppy disk drive having a floppy disk; and means for storing said channel gain data and said equalizer data on said floppy disk.

7. An automatic adjustment system for an audio device comprising:

an audio analyzer;

a digital signal processor connected to are output of said audio device;

a multi-channel amplifier having channels, each having a respected gain;

a time-alignment device for correcting a phase relationship between said respective signals;

means for entering and storing a goal profile defining a desired frequency response of said audio device;

means for storing equalizer data;

a parametric equalizer of said digital signal processor having means for altering said frequency response of said audio device responsively to said equalizer data;

said audio analyzer having a means for generating a reference signal and transmitting said reference signal to said audio device;

said audio analyzer having means for measuring said frequency response; and said audio analyzer having means for changing said equalizer data responsively to said goal profile and said measuring.

8. Apparatus as in claim 7, further comprising means for adjusting said respective gains responsively to said goal profile and said measuring.

9. Apparatus as in claim 8, wherein:

said audio device produces an output signal when said reference signal is transmitted to said audio device;

each of said channels carries a portion of said output signal;

said portion ranging over a respective frequency band of said each of said channels;

said means for adjusting includes means for averaging said frequency response over each of said respective frequency bands to produce a first series of averages, each corresponding to one of said frequency bands;

said means for adjusting includes means for averaging said goal profile over said each of said respective frequency bands to produce a second series of averages, each corresponding to one of said frequency bands; and said means for adjusting includes means for changing said gain of said channel corresponding to each of said frequency bands by an amount equal to a difference between said average of first series corresponding to said each of said frequency bands and said average of second series corresponding to said each of said frequency bands minus a difference between said average of first series corresponding to a one of said frequency bands and said average of second series corresponding to said one of said frequency bands.

10. Apparatus as in claim 1, further comprising:

at least two amplifiers;

each of said amplifiers having a gain; and means for controlling each of said gains of said amplifiers responsively to commands from said audio signal analyzer.

11. An automatic adjustment system for audio devices comprising:

an audio device having at least two amplifiers;

each of said at least two amplifiers having a gain;

automatic adjustment means connectable to said audio device;

means for controlling each of said gains of said at least two amplifiers responsively to commands from said automatic adjustment means;

said automatic adjustment means including:

a microprocessor;

a transmission unit for receiving control signals from an audio signal analyzer;

each of said at least two amplifiers having an input;

a signal applied to each of said inputs;

an input control unit for attenuating said signal applied to said input;

each of said input control units having an output;

each of said amplifiers having a power amplifier; and said output of said each of said input control units being applied to said power amplifier.

12. Apparatus as in claim 1, further comprising:

means for connecting said audio signal analyzer to said audio device;

said means for connecting including a data link;

means for monitoring an integrity of said data link;

said means for monitoring including means for sending a connection check command from said analyzer means to said audio device; and said means for monitoring including means for responding to said connection check command.

13. Apparatus as in claim 1, further comprising:

said means for automatically adjusting said equalizer being responsive to an automatic adjustment procedure thereof;

at least one of said audio signal analyzer and said audio device having a user interface having means for entering control commands; and means for blocking said control commands during said automatic adjustment procedure.

14. A system for analyzing an output of an audio device, comprising:

means for storing equalizer data;

equalizer means for dividing said output into a plurality of frequency subbands;

means for detecting a frequency response of said output;

said equalizer means including means for selectively amplifying each of said frequency subbands in response to an output of said means for detecting a frequency response and said equalizer data;

at least first and second channels of said audio device;

each of said subbands together with at least another of said subbands forming one of a plurality of bands, each consisting of a contiguous range of frequencies defined by a lower cutoff frequency and an upper cutoff frequency;

means for selectively directing each of said bands to a corresponding one of said channels;

means for generating a real-time histogram-type display of said frequency response; and means for graphically displaying said lower cutoff frequency and said upper cutoff frequency at each of said bands with said histogram-type display.

15. Apparatus as in claim 14, wherein said means for graphically displaying includes means for displaying said lower cutoff frequency and said upper cutoff frequency as a bar graph.

16. Apparatus as in claim 14, wherein said means for displaying said lower cutoff frequencies and said upper cutoff frequencies is updated when said lower cutoff frequencies and said upper cutoff frequencies are changed.

17. A gain adjustment system for channels of a multichannel amplifier of an audio system, comprising:

each of said channels having an adjustable gain;

a parametric equalizer for modifying an output of said audio device and outputting separate signals;

each of said signals being directed to a corresponding one of said channels;

each of said channels having means for driving a respective speaker;

said parametric equalizer having an input;

analyzer means, connectable to said parametric equalizer, for generating a reference signal and applying said reference signal to said input of said parametric equalizer; and said analyzer means including means for detecting a sound intensity level generated by an output of each of said respective speakers and indicating a result of said detecting for bearing said adjustable gain.

18. Apparatus as in claim 17, wherein said means for indicating includes the generation of a digital audio message.

19. Apparatus as in claim 17, further comprising:

means for determining when said output of said each of said respective speakers is below a specified level;

means for directing a user to increase said adjustable gain of a one of said channels that drives said each of said respective speakers when said each of said respective speakers is below said specified level;

means for determining when said output of said each of said respective speakers is above another specified level; and means for directing a user to decrease said adjustable gain of said one of said channels that drives said each of said respective speakers when said each of said respective speakers is above said specified level.

20. An automatic adjustment system for audio devices comprising:

a memory for storing equalizer data;

an audio device having programmable equalizer means for selectively modifying an audio output thereof according to said equalizer data;

an audio signal analyzer having means for generating a reference signal;

said audio signal analyzer being connectable to at least one of said programmable equalizer means and said audio device;

said audio device including means for generating an audible output responsively to said reference signal;

means for storing a current goal profile;

said audio signal analyzer including means for comparing said audible output with said current goal profile;

means for automatically adjusting said equalizer data responsively to a result of said comparing;

means for entering a proposed goal profile;

said means for entering including means for comparing said proposed goal profile with said current goal profile stored in said means for storing and one of confirming and rejecting said proposed goal profile responsively to a result of said comparing.

21. Apparatus as in claim 20, further comprising:

means for piece-wise integrating an absolute value of a differential function to generate a parameter;

said differential function being equal to a difference between said proposed goal profile and said current goal profile;

said means for comparing including means for confirming said proposed goal profile when said parameter is one of less than and equal to a specified value; and said means for comparing including means for rejecting said proposed goal profile when said parameter is greater than said specified value.

22. An automatic adjustment system for audio devices comprising:

a memory for storing programmable gain data and equalizer data;

an audio device having programmable equalizer means for selectively modifying an audio output thereof according to said equalizer data;

said audio device having programmable amplifier means for amplifying said audio output according to said programmable gain data;

audio analyzer means, connectable to said audio device, having means for overwriting said programmable gain data and said equalizer data with adjusted programmable gain data and adjusted equalizer data, respectively;

said audio signal analyzer having means for generating a reference signal;

said audio device including means for generating an audible output responsively to said reference signal;

said audio signal analyzer having means for storing goal data indicating a desired result of said amplifying and said modifying;

means for comparing said goal data with said audible output; and said audio analyzer including means for permanently storing said goal data, said adjusted gain data and said equalizer data.

23. A device for automatically adjusting an audio system, comprising:

an audio device having an output;

a signal processor;

means for applying said output to said signal processor;

means for storing equalizer data;

said signal processor including means for altering a frequency response of said output, responsively to said equalizer data, to generate a corrected output;

an audio analyzer;

means for connecting said audio analyzer to said signal processor;

means for entering a goal curve in said audio analyzer;

said goal profile indicating a desired result of said altering when a reference signal is applied to said signal processor;

said audio analyzer including means for storing said goal profile in said means for storing;

said audio analyzer including means for generating said reference signal and applying said reference signal to said signal processor;

said audio analyzer including means for measuring said frequency response;

said audio analyzer including means for adjusting said equalizer data responsively to said measuring and said goal data;

said audio analyzer including means for saving said goal profile and said equalizer data on a nonvolatile memory;

said audio analyzer including means for printing out said goal profile; and means for restoring said goal profile data and said equalizer data from said means for saving to said signal processor.

24. Apparatus as in claim 3, further comprising:

means for entering text data; and means for storing said text data in said nonvolatile storage means.

* * * * *

UNITED STATES PATENT AND TRADEMARK OFFICE

CERTIFICATE OF CORRECTION

PATENT NO. : 5,581,621

DATED : December 3, 1996

INVENTOR(S) : Yoshihide Koyama, et al.

It is certified that error appears in the above-identified patent and that said Letters Patent is hereby corrected as shown below:

Title page,

Delete --Item [63] Related U.S. Application Data:

Continuation of Ser. No. 53,267, Apr. 28, 1993--

Signed and Sealed this

First Day of July, 1997

Attest:

BRUCE LEHMAN

*Attesting Officer*

*Commissioner of Patents and Trademarks*